(12) United States Patent
Harris et al.

(10) Patent No.: US 7,671,653 B2
(45) Date of Patent: Mar. 2, 2010

(54) DUAL EDGE TRIGGERED FLIP FLOPS

(75) Inventors: David Money Harris, Upland, CA (US); Scott M. Fairbanks, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 47 days.

(21) Appl. No.: 11/864,504

(22) Filed: Sep. 28, 2007

(65) Prior Publication Data

US 2009/0085629 A1 Apr. 2, 2009

(51) Int. Cl.
 *H03K 3/00* (2006.01)
(52) U.S. Cl. .................................... 327/218; 327/212
(58) Field of Classification Search ................ 327/199, 327/203, 211, 212, 214, 218, 223, 224
See application file for complete search history.

(56) References Cited

U.S. PATENT DOCUMENTS

| 5,793,236 | A  | * | 8/1998  | Kosco ............................ 327/218 |
| 6,301,322 | B1 | * | 10/2001 | Manning ......................... 377/54 |
| 6,456,136 | B1 | * | 9/2002  | Sutherland et al. ............ 327/225 |
| 6,762,957 | B2 | * | 7/2004  | Hsu et al. ................... 365/189.05 |

OTHER PUBLICATIONS

Gago et al., "Reduced Implementation of D-Type DET Flip-Flops", IEEE Journal of Solid-State Circuits, vol. 28, No. 3, pp. 400-402, Mar. 1993.

Gerosa et al., "A 2.2 W, 80 MHz Superscalar RISC Microprocessor", IEEE Journal of Solid-State Circuits, vol. 29, No. 12, pp. 1440-1454, Dec. 1994.

Naffziger et al., "The Implementation of the Itanium 2 Microprocessor", IEEE Journal of Solid-State Circuits, vol. 37, No. 11, pp. 1448-1460, Nov. 2002.

Nedovic et al., "Dual-Edge Triggered Storage Elements and Clocking Strategy for Low-Power Systems", vol. 13, No. 5, pp. 577-590, May 2005.

Nikolić et al., "Improved Sense-Amplifier-Based Flip-Flop: Design and Measurements", IEEE Journal of Solid-State Circuits, vol. 35, No. 6, pp. 876-884, Jun. 2000.

Tschanz et al., "Comparative Delay and Energy of Single Edge-Triggered & Dual Edge-Triggered Pulsed Flip-Flops for High-Performance Microprocessors", International Symposium on Low Power Electronics and Design, Proceedings of the 2001 International Symposium on Low Power Electronics and Design, pp. 147-152, 2001.

* cited by examiner

*Primary Examiner*—Hai L Nguyen
(74) *Attorney, Agent, or Firm*—Dorsey & Whitney LLP

(57) ABSTRACT

An implicitly pulsed dual edge triggered pulsed latch. The implicitly pulsed latch includes an overlapping clock generator and a transparency circuit designed to cause a transparent latch circuit to become transparent on each edge of a clock signal. A logic value on the input node of the latch is transferred to the output node of the latch in response to each clock edge transition. An explicitly pulsed dual edge triggered pulsed latch including a pulse generator and a transparent latch circuit. The explicitly pulsed latch includes a symmetrical pulse generator designed to cause the latch circuit to pass a logic value from the input node of the latch to the output node of the latch in response to a pulse on the clock node.

15 Claims, 25 Drawing Sheets

Implicitly Pulsed DET Jamb Pulsed
Latch With Synchronous Reset

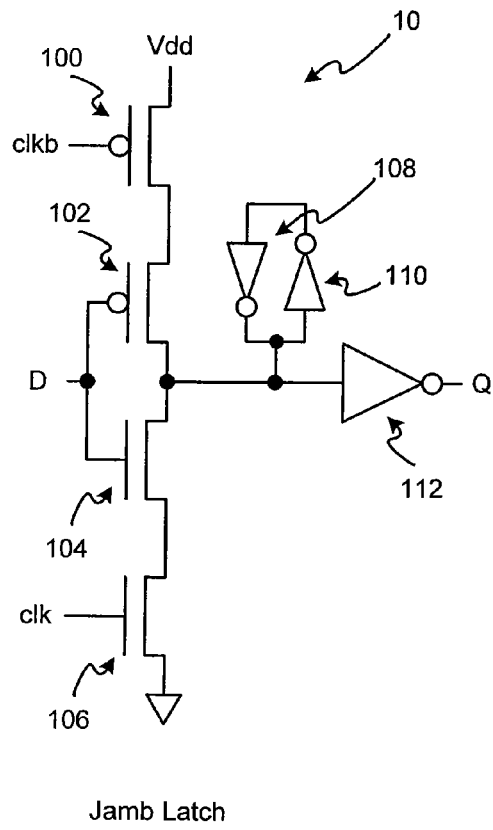
Jamb Latch
FIG. 1A
PRIOR ART
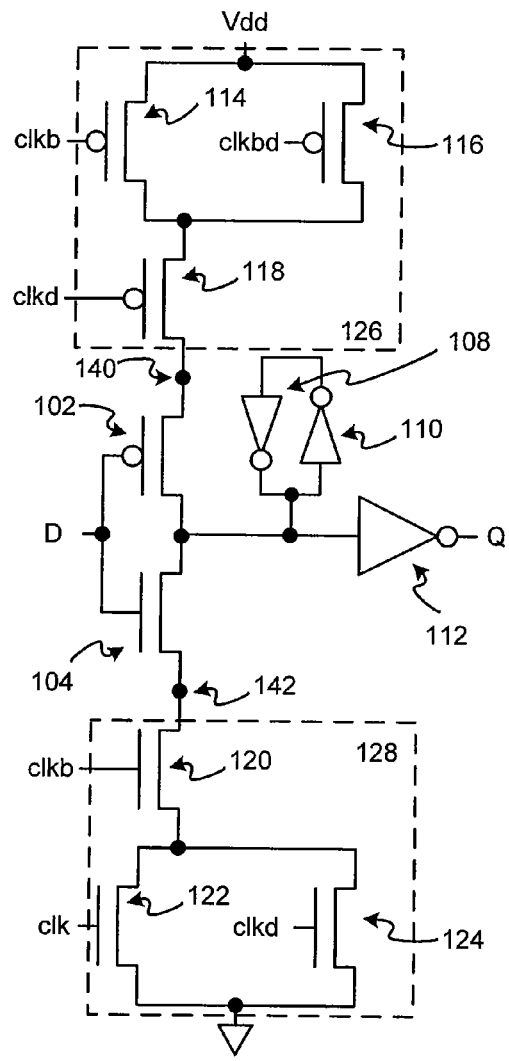
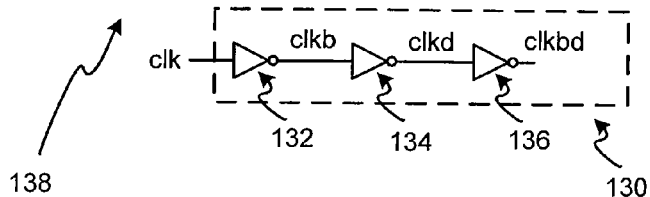
Implicitly Pulsed DET Jamb
Pulsed Latch
FIG. 1B

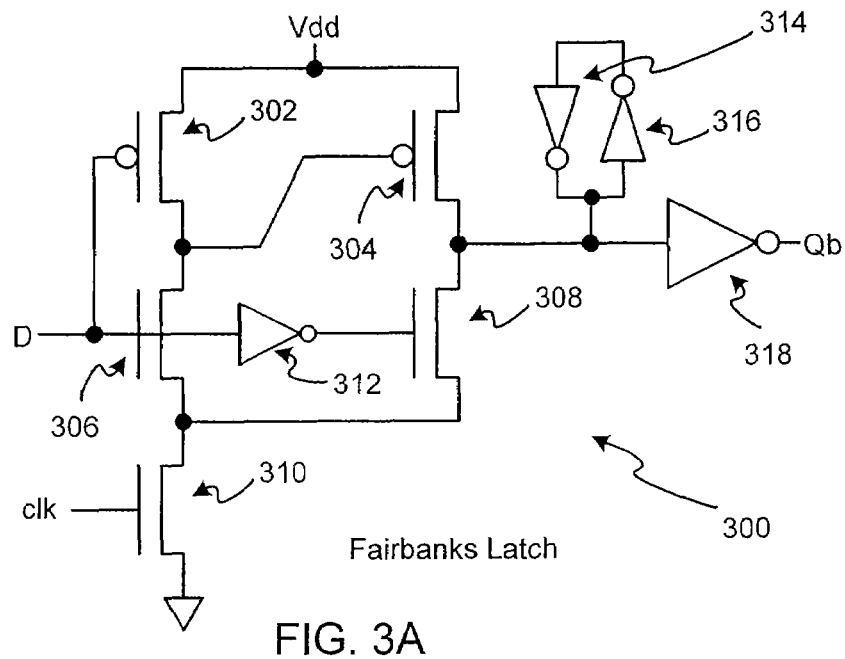
FIG. 3A  Fairbanks Latch
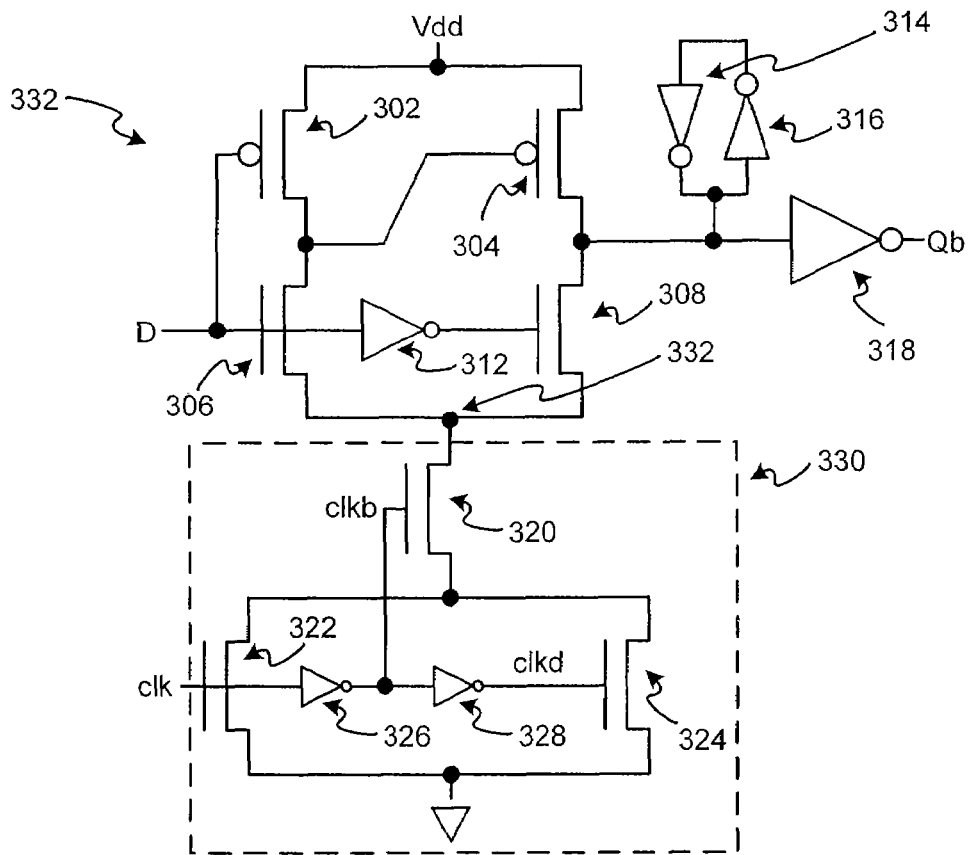
FIG. 3B  Implicitly Pulsed DET Fairbanks Pulsed Latch Transmission Gate Latch Implicitly Pulsed DET
Transmission Gate Latch Differential Implicitly
DET Pulsed Latch Implicitly Pulsed DET Jamb Pulsed
Latch With Asynchronous Reset Implicitly Pulsed DET Fairbanks Pulsed
Latch With Asynchronous Reset Implicitly Pulsed DET Transmission
Gate Latch With Asynchronous Reset Differential Implicitly DET Pulsed
Latch With Asynchronous Reset Implicitly Pulsed DET Jamb Pulsed
Latch With Synchronous Reset Implicitly Pulsed DET Fairbanks Pulsed
Latch With Synchronous Reset Differential Implicitly Pulsed DET
Pulsed Latch With Synchronous Reset

DUAL EDGE TRIGGERED FLIP FLOPS

FIELD OF THE INVENTION

Aspects of the present invention relate to sequential logic circuits. One particular aspect of the present invention relates to dual edge triggered flip-flop circuits that sample data on both edges of a clock.

BACKGROUND

Power dissipation of electronic circuits is becoming increasingly significant. Power consumption in sequential circuits is generally proportional to clock frequency. As designers continue to increase clock frequency in order to boost circuit performance, the power required to distribute the clock and drive the clock inputs of the sequential circuitry may account for a third or more of total chip power consumption. Dual edge triggered clocking schemes may be attractive because they allow a global clock to be distributed at half frequency. This reduction in clock frequency may result in significant power savings.

A challenge of dual edge triggered clocking schemes is that the sequential circuits (flip-flops, latches and other state holding elements) tend to be more complicated and can result in increased power consumption and/or slower devices. Dual edge triggered clocking schemes also tend to preclude phase-based designs such as transparent latches and/or traditional domino circuits. Yet another challenge in dual edge triggered clocking schemes is that the duty cycle of the clock generally has to be well controlled to avoid introducing additional skew on the falling edge of the clock.

What is needed are sequential circuits, or storage elements, that store data on both clock edges, thereby saving energy when distributing a clock signal. The merit of a sequential circuit may be measured by its efficiency with respect to power, latency and robustness given timing uncertainty. What is further needed are dual edge triggered flip flop circuits that employ pulsed latches to store data on both clock edges in a fast, efficient and robust manner.

SUMMARY

One aspect of the present invention involves an implicitly pulsed dual edge triggered pulsed latch. The latch includes a clock input for receiving a clock signal, an overlapping clock generator for generating a plurality of overlapping clock signals in response to the clock signal, a transparency circuit that has an output node that transitions from a high resistance state to a low resistance state and back to a high resistance state in response to an edge transition on the clock signal and a transparent latch circuit. The transparent latch circuit includes an input node, an output node and a transparency node configured to make the latch transparent when the transparency node is at a low resistance. The dual edge triggered pulsed latch passes a logic value on the input node of the latch circuit to the output node of the latch circuit in response to the edge transition on the clock signal.

Another aspect of the present invention involves an implicitly pulsed dual edge triggered pulse latch having a clock input for receiving a clock signal, an overlapping clock generator for generating a plurality of overlapping clock signals in response to the clock signal, a first transparency circuit, a second transparency circuit and a transmission gate circuit. The first transparency circuit has a data input node and becomes transparent when the clock signal and first overlapping clock signal are active. The second transparency circuit is coupled in parallel with the first transparency circuit and becomes transparent when a third overlapping clock signal and fourth overlapping clock signal are active. The transmission gate circuit includes a third transparency circuit that becomes transparent when the clock signal and first overlapping clock signal are active and a data output node. The dual edge triggered pulsed latch passes a logic value on the data input node to the data output node in response to an edge transition on the clock signal.

Yet another aspect of the present invention involves an explicitly pulsed latch that includes a pulse generator and a transparent latch circuit. The pulse generator includes a clock input for receiving a clock signal, an overlapping clock generator for generating a plurality of overlapping clock signals in response to the clock signal and an explicit pulse circuit for generating a pulse in response to each edge of the clock signal on an output port. The transparent latch circuit includes an input node, an output node, a clock node. The pulse generator generates symmetrical pulses and the explicitly pulsed dual edge triggered pulsed latch passes a logic value on the input node to the output node in response to the pulse on the clock node.

BRIEF DESCRIPTION OF THE DRAWINGS

FIG. 1A depicts a Jamb latch circuit.

FIG. 1B depicts the Jamb latch of FIG. 1A modified to form an implicitly pulsed dual edge triggered Jamb pulsed latch circuit.

FIG. 3A depicts a Fairbanks latch circuit.

FIG. 3B depicts the Fairbanks latch circuit of FIG. 3A modified to form an implicitly pulsed dual edge triggered Fairbanks pulsed latch circuit.

DETAILED DESCRIPTION OF EMBODIMENTS OF THE INVENTION

Figure 2:
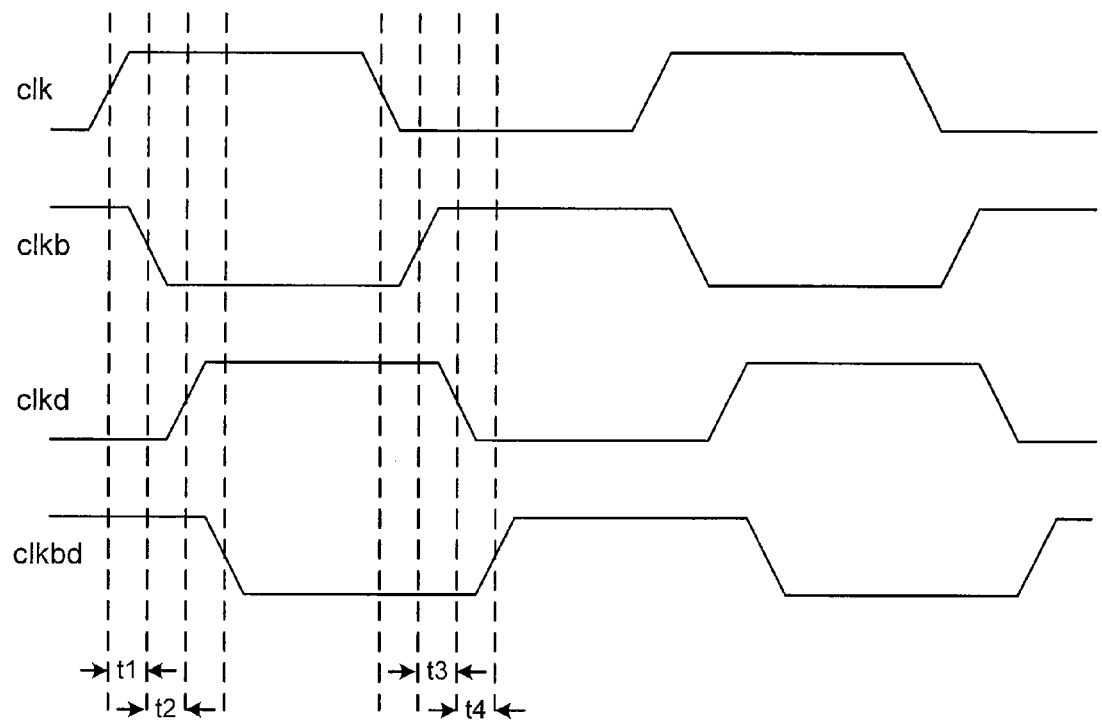
FIG. 2 depicts a timing diagram of a string of three delay inverters 14, 15, 16 of FIG. 1B used to generate overlapping clock signals.

Dual edge triggered pulsed latches may be used in place of dual edge triggered flip-flops because they are generally faster and may provide a modest amount of time borrowing. An "implicitly" pulsed dual edge triggered pulsed latch uses the stack of clocked transistors within the latch to receive partially overlapping clocks to activate the latch at the appropriate times, whereas an "explicitly" pulsed dual edge triggered pulsed latch uses a pulse generator that produces pulses on the rising and falling edges of a clock to drive a conventional transparent latch. Aspects of the present invention involve both implicit and explicit pulse generators that are used to convert transparent latches that become transparent when the clock is active (either high or low) into dual edge triggered pulsed latches that become transparent for a brief window on both edges of the clock.

One aspect of the present invention involves an implicitly pulsed dual edge triggered pulsed latch which involves substituting a clocked stack of transistors and an overlapping clock generator (such as a string of delay inverters) for the clocked input transistor(s) of a conventional transparent latch, as described in more detail below. In an implicitly pulsed dual edge triggered pulsed latch, the clocked stack of transistors is driven by partially overlapping clocks and causes the latch to be become transparent at the appropriate times. A clocked NMOS transistor stack may be substituted for a transistor driven by an active high clock and a clocked PMOS transistor stack may be substituted for an a transistor driven by an active low clock. An NMOS transistor stack and a PMOS transistor stack may be used in a pulsed latch design having active high and active low clocked transistors. The partially overlapping clock signals may be generated by a string of two or more delay inverters.

FIG. 1B depicts a jamb latch of FIG. 1A modified to form an implicitly pulsed dual edge triggered pulsed latch. First, FIG. 1A depicts a conventional jamb latch that becomes transparent (i.e., allows the D input to be passed to the output) when the clock is a logic one (i.e., an active high clock). The jamb latch 10 generally has a transistor 106 driven by an active high clock signal, clk, and another transistor 100 driven by its complement (active low), clkb. Thus, the clock signal clk drives the gate of the n-channel transistor 106 and the complement of the clock signal clkb drives the gate of the p-channel transistor 100. The jamb latch becomes transparent when the clock signal transitions to a logic one allowing the D input (or data value) to be passed to the Q output. The jamb latch becomes opaque (i.e., the D input is not passed to the output) when the clock signal transitions to a logic zero causing the Q value to be held. In this and other figures, a suffix b on a signal name stands for bar, meaning that the signal is inverted. The suffix d stands for delayed, and the suffix bd stands for delayed and inverted.

When D is at a logic one, transistor 102 is off and transistor 104 is conducting. Then, when the clock signal transitions to a logic one, transistor 106 becomes conducting causing the input of 112 to be pulled to a logic zero (through transistors 104, 106). When D is at a logic zero, transistor 102 is conducting and transistor 104 is off. In this case, when the clock signal transitions to a logic one, clkb transitions to a logic zero causing transistor 100 to become conducting. The input of inverter 112 is pulled to a logic one (through transistors 100, 102). When the clock signal transitions to a logic zero, the jamb latch 10 becomes opaque (transistors 100, 106 are off) and the Q value is held on the output.

If the D input switches while the latch 10 is opaque, some charge sharing noise may occur. A keeper (back-to-back inverters 108, 110) and output inverter 112 may be appropriately designed to reject the noise. The keeper also holds the value at the input of inverter 112 while the latch is opaque. Inverter 108 generally should be weak enough so that it can be overpowered by transistors 104, 106 or 100, 102 when the latch is transparent.

Referring now to FIG. 1 B, the clocked transistor stacks (or transparency circuits) 126, 128 replace clocked transistors 100, 106 in the jamb latch 10. More particularly, the clocked PMOS transistor stack 126 replaces the p-channel transistor 100 and clocked NMOS transistor stack 128 replaces the n-channel transistor 106. Unlike the traditional jamb latch of FIG. 1A which is transparent when the clock signal is a logic one, the two transistor stacks cause the latch 138 of FIG. 1B to become transparent for a brief window around the rising and falling edges of the clock. A string of three delay inverters 132, 134, 136 may be used as an overlapping clock generator 130 to produce the overlapping clkb, clkd and clkbd signals needed to clock the two transistor stacks 126, 128. Other embodiments may use other types of delay elements to delay and invert the clock signal clk to generate the overlapping clock signals.

FIG. 2 depicts a timing diagram of a string of three delay inverters 132, 134, 136 that may be used as an overlapping clock generator 130 to generate the overlapped clk signal, clkb signal (the clock signal delayed and inverted), clkd signal (the clkb signal delayed and inverted) and clkbd signal (the clkd signal delayed and inverted). When the clk transitions to a logic one, the NMOS stack 128, connected to transparency node 142, becomes transparent (i.e., has a low resistance) for a brief window t1 and the PMOS transistor stack 126, connected to transparency node 140, becomes transparent for a brief window t2. When the clk transitions to a logic zero, the NMOS stack 128 becomes transparent for a brief window t3 and the PMOS stack 126 becomes transparent for a brief window t4. At other times, the transistor stacks 126, 128 are opaque (i.e., have a high resistance). That is, high resistance states of the transistor stacks keep the output of the latch circuit from changing, while low resistance states allow the input of the latch circuit to be passed to the output of the latch circuit. It should be noted that the PMOS transistor stack 126 transparency is slightly delayed from the NMOS transistor stack 128 transparency.

When D is at a logic one, transistor 104 is conducting and transistor 102 is off. When clk transitions to a logic one, NMOS stack 128 becomes transparent during window t1 causing the input of inverter 112 to be pulled to a logic zero (through transistors 104, 120, 122). Then, when clk transitions to a logic zero, NMOS stack 128 again becomes transparent during window t3 causing the input of inverter 112 to be pulled to a logic zero (through transistors 104, 120, 124).

When D is at a logic zero, transistor 104 is off and transistor 102 is conducting. When clk transitions to a logic one, PMOS stack 126 becomes transparent during t2 causing the input of inverter 112 to be pulled to a logic one (through transistors 114, 118, 102). Then, when clk transitions to a logic zero, PMOS stack 126 becomes transparent during t4 causing the input of inverter 112 to be pulled to a logic one (through transistors 116, 118, 102).

This dual edge triggered jamb latch 138 has twenty transistors (including two transistors for each inverter), of which twelve switch with the activity factor of the clock (i.e., the transistors 114, 116, 118, 120, 122, 124 and the six transistors of delay inverters 132, 134, 136 switch every clock cycle).

FIG. 3B depicts a Fairbanks latch of FIG. 3A modified to form an implicitly pulsed dual edged triggered Fairbanks pulsed latch 332. First, FIG. 3A depicts a Fairbanks latch 300 that is transparent when clk is at a logic one. The Fairbanks latch is described in U.S. Pat. No. 6,456,136 to Sutherland et al., issued on Sep. 24, 2002 and assigned to Sun Microsystems, Inc., which is incorporated herein by reference. The Fairbanks latch 300 has a single clocked transistor 310 that causes the latch to become transparent when the clk is at a logic one. Referring now to FIG. 3B, a clocked NMOS transistor stack (a transparency circuit comprising transistors 320, 322, 324) and two delay inverters 326, 328 (an overlapping clock generator) form a dual implicit pulse generator 330, connected to transparency node 332, that replaces the single clocked transistor 310 of latch 300. The implicit pulse generator 330 causes the implicitly pulsed latch 332 of FIG. 3B to become transparent for a brief window on the rising and falling edges of the clock. Because the Fairbanks latch 300 is driven by a single clocked NMOS transistor (active high), a clocked PMOS transistor stack and a third delay inverter are not needed in this implicitly pulsed dual edge triggered latch design.

Figure 4:
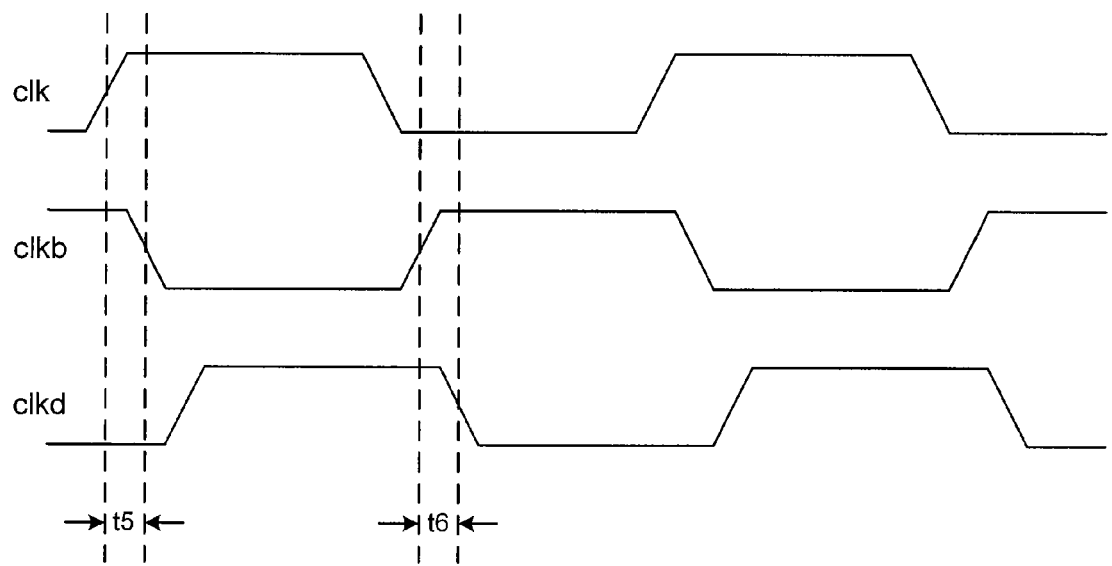
FIG. 4 depicts a timing diagram of the dual implicit pulse generator of FIG. 3B.

FIG. 4 depicts a timing diagram for the clocked NMOS transistor stack (transistors 320, 322, 324) and string of two delay inverters 326, 328 of the dual implicit pulse generator circuit 330 of FIG. 3B. When the clk transitions to a logic one, the NMOS transistor stack becomes transparent during window t5 (transistors 320, 322 are conducting) allowing the D input to be passed to the output Q. When the clk transitions to a logic zero, the NMOS transistor stack again becomes transparent during window t6 (transistors 320, 324 are conducting) allowing the D input to be passed to the output Q. This latch design has nineteen transistors (including two transistors for each delay inverter), of which seven (transistors 320, 322, 324 and the four transistors of delay inverters 326, 328) switch with the activity factor of the clock.

Figure 5A:
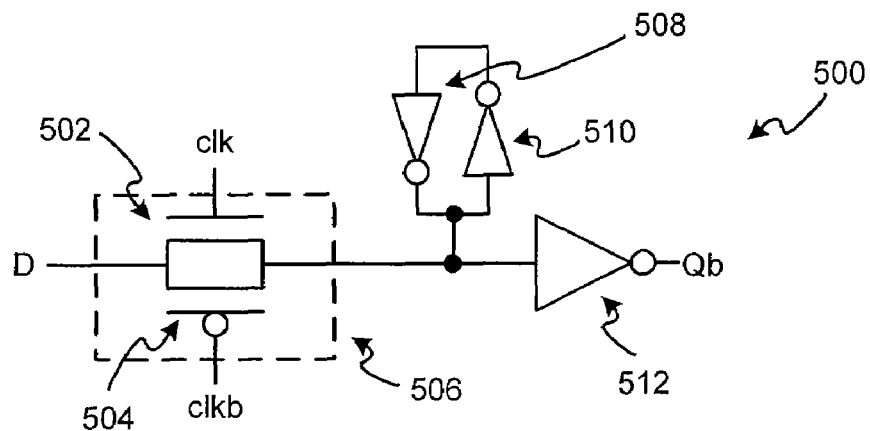
FIG. 5A depicts a transmission gate latch circuit.
Figure 5B:
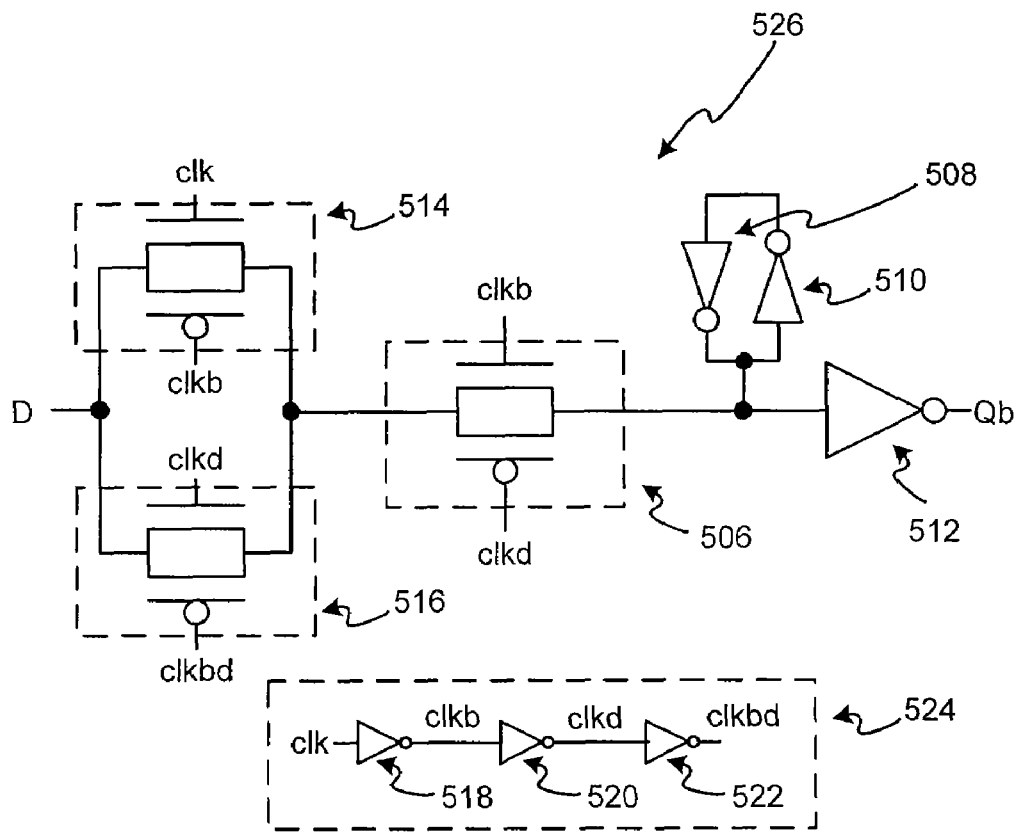
FIG. 5B depicts the transmission gate latch circuit of FIG. 5A modified to form an implicitly pulsed dual edge triggered transmission gate pulsed latch circuit.

FIG. 5B depicts a transmission gate latch 500 of FIG. 5A modified to form an implicitly pulsed dual edge triggered transmission gate pulsed latch 526. First, FIG. 5A depicts a transmission gate latch 500 that is transparent when clk is at a logic one. A n-channel transistor 502 in parallel with a p-channel transistor 504 form a transmission gate 506 that becomes transparent when the clock transitions to a logic one, allowing the D input to be passed to the output. When the clock transitions to a logic zero, the transmission gate 506 is opaque and the data value is held. Referring now to FIG. 5B, two additional transmission gates 514, 516 and a string of delay inverters 518, 520, 522 (overlapping clock generator 524) may be used to cause the transmission latch 500 to become transparent on each edge of the clock.

The implicitly pulsed latch 526 of FIG. 5B may be viewed as an implicitly pulsed dual edge triggered mux-latch. Some implementations of the present invention may insert an inverter at the input or between the two transmission gates to reduce the number of series transistors. The pulsed latch 526 has eighteen to twenty transistors, of which twelve switch with the activity factor of the clock. The latch 526 is very similar to the implicitly pulsed dual edge triggered jamb pulsed latch 138 (depicted in FIG. 1B) but uses transmission gates rather than a clocked CMOS stack to make the latch transparent on each edge of the clock. Referring back to FIG. 2, when the clk transitions to a logic one, transmission gates 506, 514 become transparent during window t1 allowing the D input to pass through to the output. When the clk transitions to a logic zero, transmission gates 506, 516 become transparent during window t3 allowing the D input to pass through to the output. At other times, the latch 526 is opaque and the data value is held.

Figure 6:
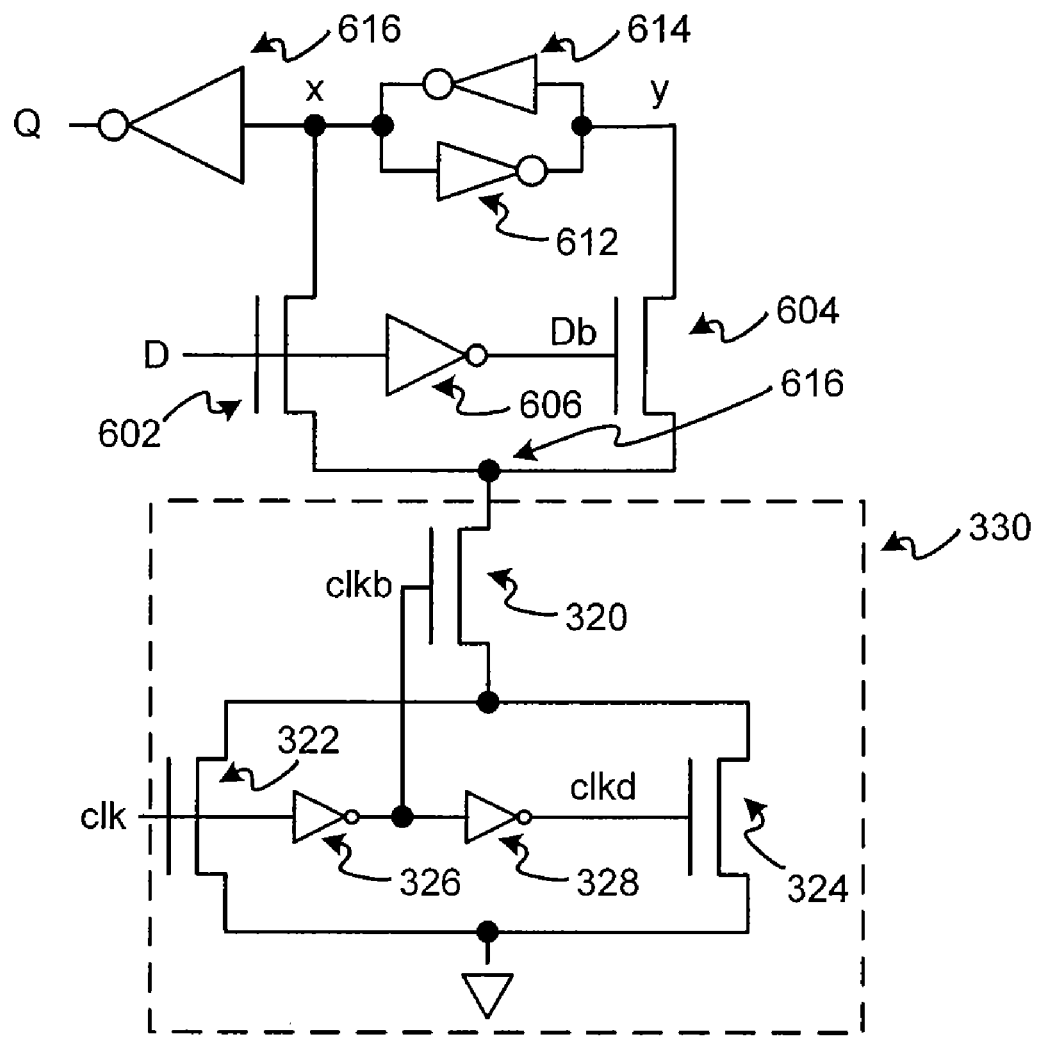
FIG. 6 depicts a differential implicitly dual edge triggered pulsed latch circuit.

FIG. 6 depicts a differential dual edge triggered pulsed latch 600 employing the dual implicit pulse generator 330 having a clocked NMOS transistor stack (transistors 320, 322, 324 form a transparency circuit) and a string of two delay inverters 326, 328. The dual implicit pulse generator 330 is connected to transparency node 616 to cause the latch to become transparent for a brief window on each edge of the clock signal clk. This differential dual edge triggered pulsed latch 600 was formed by modifying a sense-amplifier flip-flop. The clocked precharge transistors of the sense-amplifier flip-flop were replaced by weak cross-coupled inverters 612, 614 (a keeper) due to the awkward nature of doing precharge with an implicit pulse generator.

Referring back to FIG. 4, which shows the timing diagram for the implicit pulse generator 330, when clk transitions to a logic one, the latch 600 is briefly transparent during window t4 (transistors 320, 322 are conducting) allowing D to be passed through to the output Q. When D is at a logic one, transistor 602 is conducting causing node x to be pulled down to a logic zero resulting in the output node Q to be at a logic one. In the case when D is at a logic zero, transistor 604 is conducting causing node y to be pulled low to a logic zero resulting in the output node Q being at a logic zero. When clk transitions to a logic zero, the latch 600 again briefly becomes transparent during window t6 (transistors 320, 324 are conducting) allowing D to be passed through to the output node Q.

This dual edge triggered pulsed latch 600 has seventeen transistors, of which seven switch at the activity factor of the clock. Differential outputs may be provided by adding another inverter on node y. This circuit can accept and amplify low-swing differential inputs D and Db.

Figure 7:
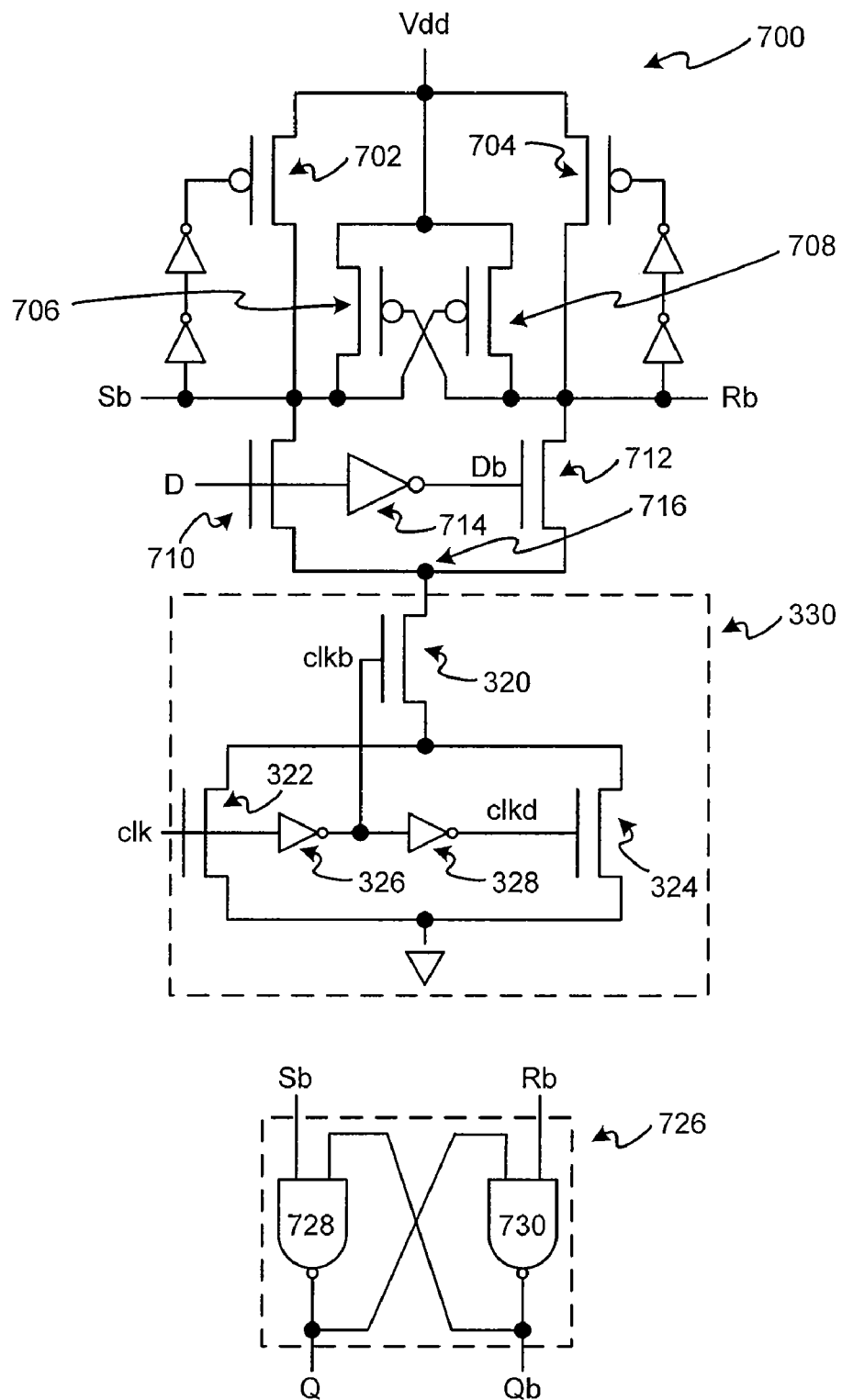
FIG. 7 depicts a self-resetting differential dual edge triggered pulsed latch circuit employing a SR slave latch.

FIG. 7 depicts a self-resetting differential dual edge triggered pulsed latch 700. A dual implicit pulse generator 330 is connected to transparency node 716 to cause the latch to become transparent for a brief window on each edge of the clock signal. Internal nodes Sb and Rb precharge using a self-timed delay. PMOS transistors 702 and 704 precharge Sb and Rb two inverter delays after the corresponding node discharges. The cross-coupled p-channel transistors 706, 708 form a keeper to improve noise immunity, especially when low-swing inputs are used. A SR output latch structure 726 holds the output after the internal nodes precharge. NAND gates 728, 730 may be used as a slave SR latch to convert the monotonically falling pulsed Sb and Rb signals to static Q outputs. The SR latch structure 726 adds two gate delays. Although the sense amplifier stage is fast, the propagation delay through the two cross-coupled NAND gates 728, 730 may hurt performance.

Figure 8:
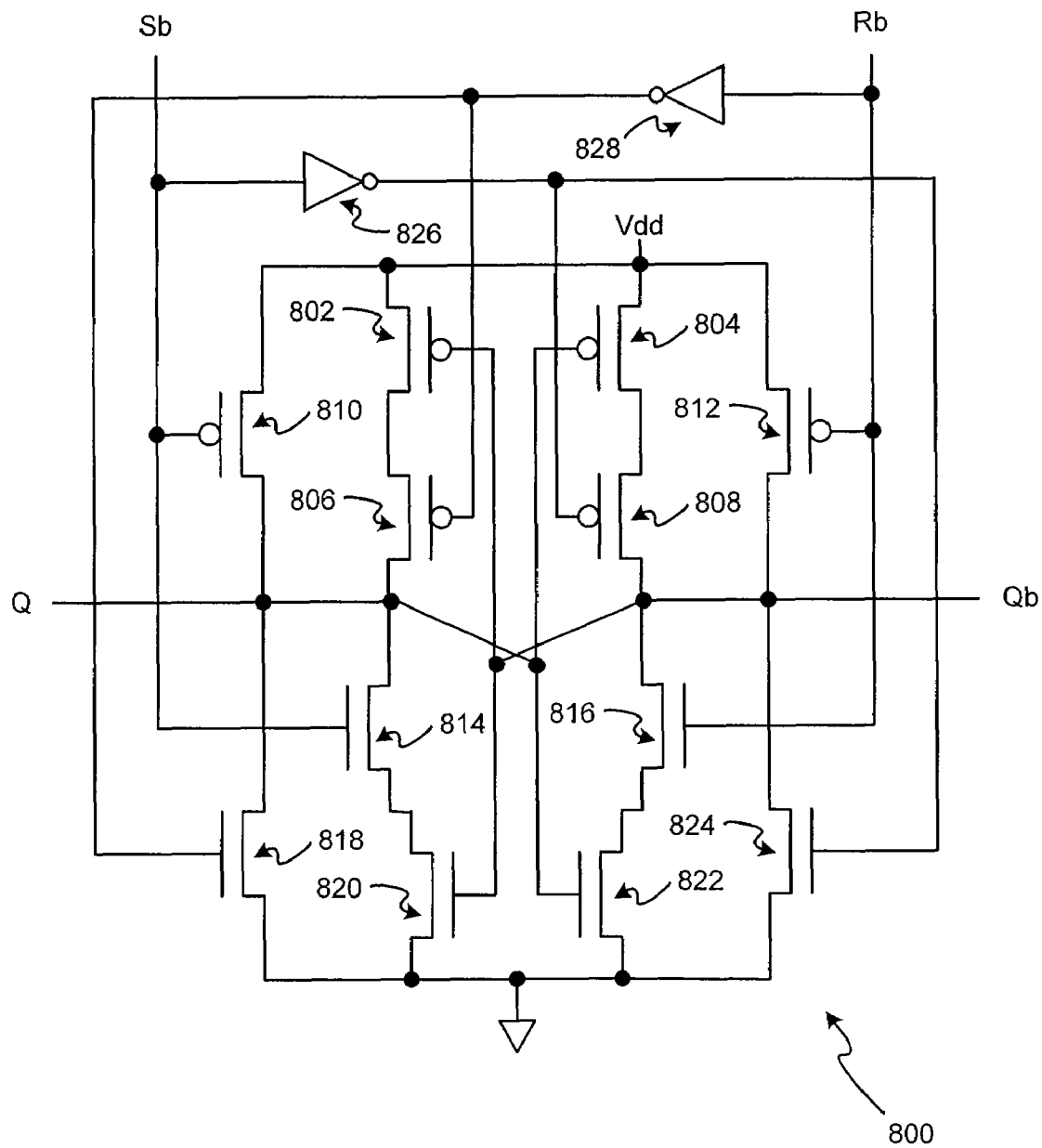
FIG. 8 depicts a Nikolic slave latch for the self-resetting differential dual edge triggered pulsed latch circuit of FIG. 7.

Alternatively, a faster Nikolic slave latch 800, as depicted in FIG. 8, may be used to replace the cross-coupled NAND gates. The Nikolic output latch 800 uses eight additional transistors. When the Sb signal falls, it turns on the p-channel transistor 810 to immediately pull the Q output high. It also drives the output of inverter 826 high, which pulls down the Qb output through the opposite n-channel transistor 824. The transistors 802, 806, 814, 820 and 804, 808, 816, 822 serve as small cross-coupled tri-state keepers that hold the outputs after the master stage precharges, but turn off to avoid contention when the outputs Q, Qb need to switch. This slave latch 800 also has two gate delays for the falling output, but the delays are generally faster because the gates avoid crowbar current.

An explicitly pulsed dual edge triggered pulsed latch may be constructed using a conventional transparent latch clocked by a pulse generator that produces pulses on the rising and falling edges of the clock. One conventional pulse generator uses a ten transistor transmission gate XOR to supply the clock to the diffusion input of a transmission gate, which may introduce issues of noise and non-uniform capacitive loading. See J. Tschanz et al, "Comparative Delay and Energy of Single Edge-Triggered & Dual Edge-Triggered Pulsed Flip-Flops for High-Performance Microprocessors," Intl. Symp. Low Power Electronic Design, 2001.

Figure 9:
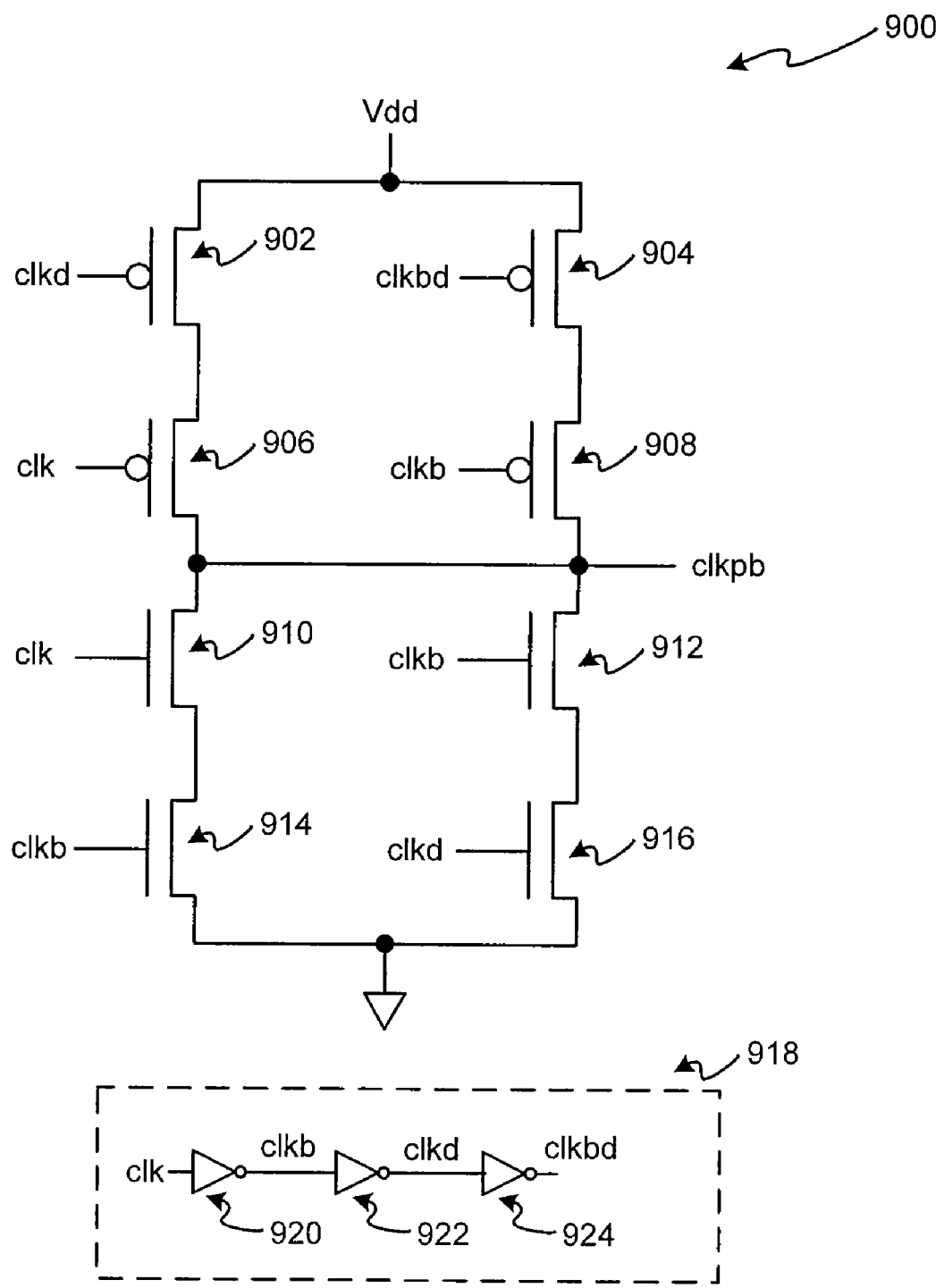
FIG. 9 depicts a pulse generator using a CMOS XOR with fourteen transistors.
Figure 10:
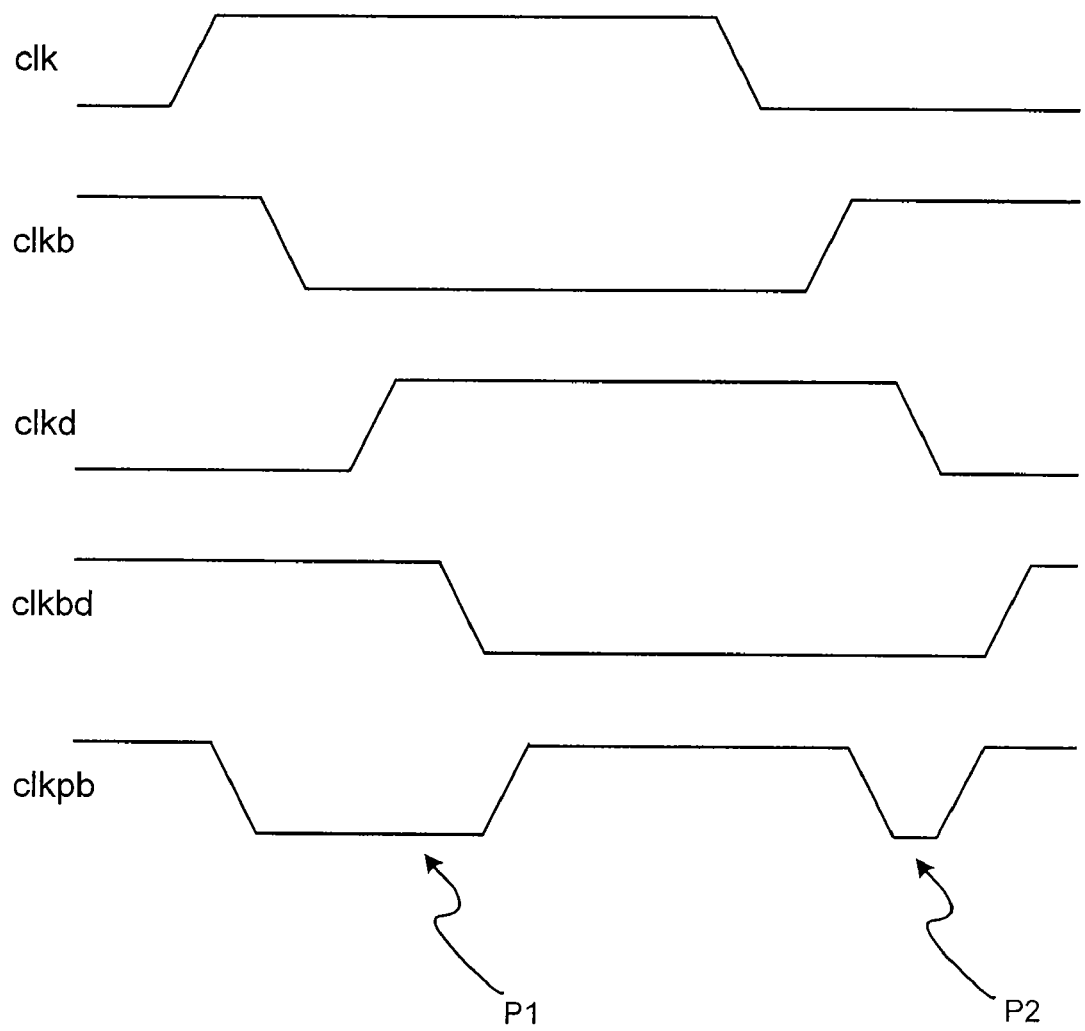
FIG. 10 depicts a timing diagram of the pulse generator depicted in FIG. 9.

FIG. 9 depicts a pulse generator 900 using a CMOS XOR with fourteen transistors (including clock delay inverter transistors, each inverter having two transistors). FIG. 10 depicts a timing diagram for the pulse generator 800 depicted in FIG. 9. When clk transitions to a logic one, there is a one-inverter delay before clkb transitions to a logic zero. During this delay, clkpb is pulled down to generate a brief logic zero pulse P1. Similarly, when clk transitions to a logic zero, clkb transitions to a logic one before clkd transitions to a logic zero. This causes clkpb to briefly generate a brief logic zero pulse P2. The duration of the pulse on clkpb is generally determined by the inverter delay. A single inverter delay may be insufficient to generate sufficient width pulses. The pulse width may be increased by using short widths and long channels on the inverter transistors. The order of the NMOS transistor stacks 910, 914 or 912, 916 may increase the pulse length because the leading edge of the pulse is activated by the inner transistor 910 or 912. Similarly, the order of the PMOS transistor stacks 906, 902 or 908, 904 may increase the pulse length because the trailing edge of the pulse is activated by the outer transistor 902 or 904. As the timing diagram of FIG. 10 depicts, the pulse generator 900 of FIG. 9 generally produces asymmetric pulses P1, P2. That is, the duration of the pulse P1 produced on the rising edge of the clock is different from the duration of the pulse P2 produced on the falling edge of the clock.

Figure 11:
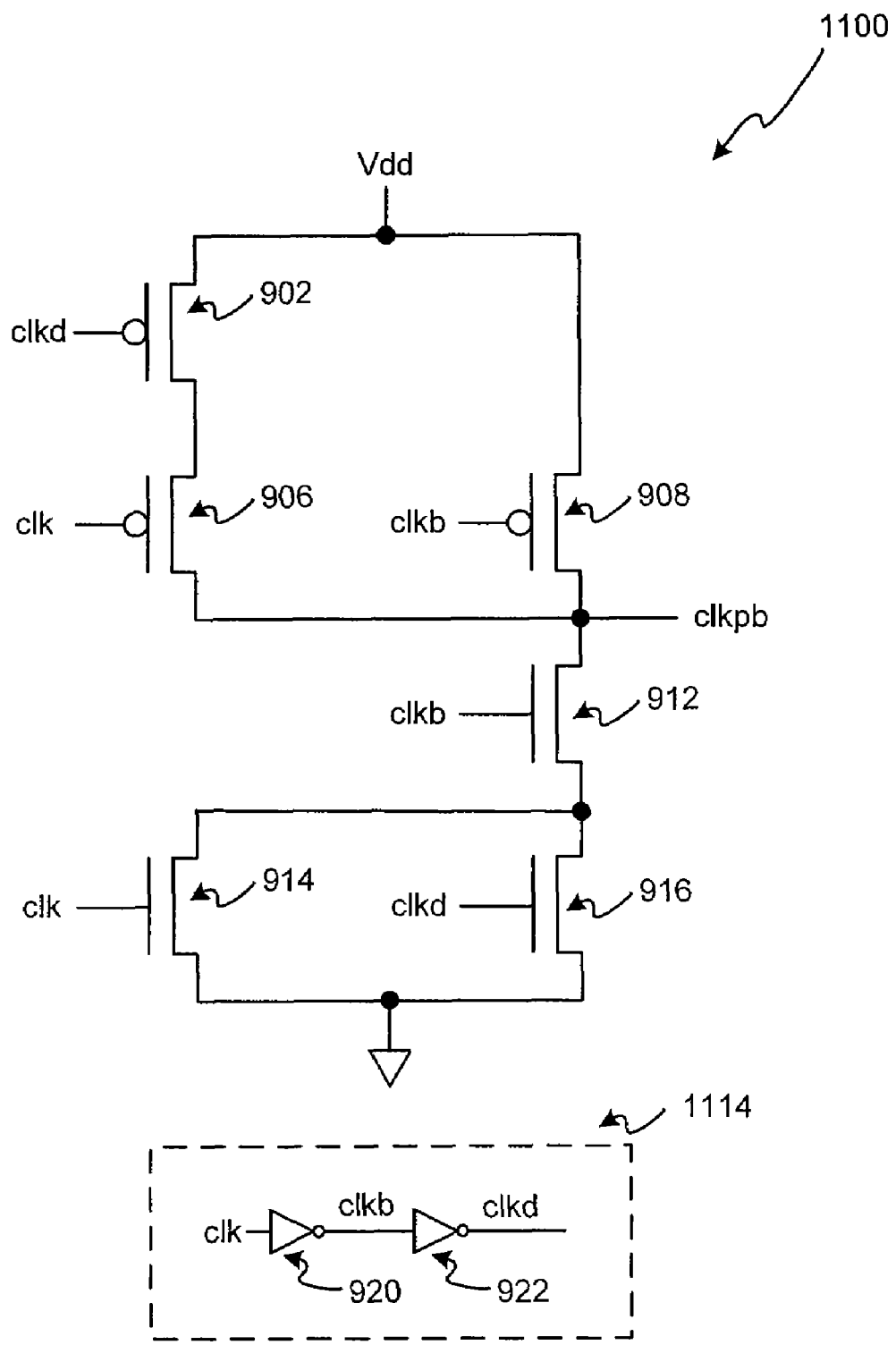
FIG. 11 depicts an explicit pulse generator having ten transistors that produces more symmetric pulses.
Figure 12:
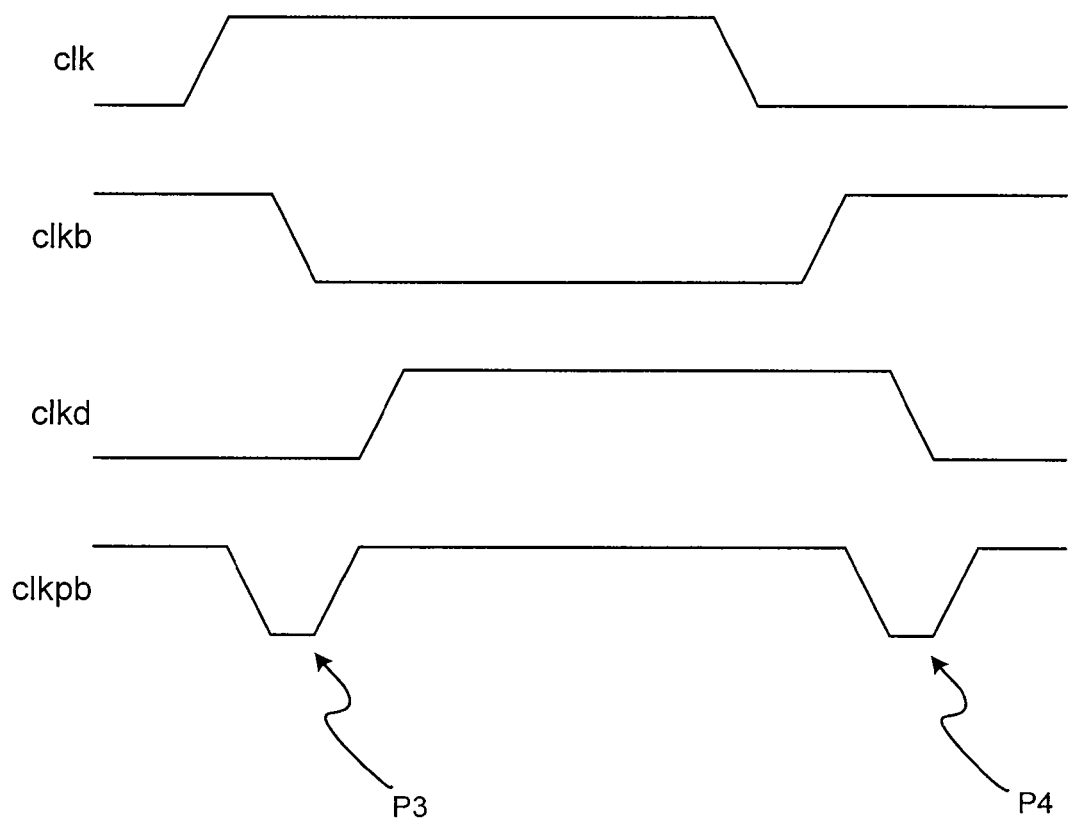
FIG. 12 depicts a timing diagram of the explicit pulse generator of FIG. 11.

FIG. 11 depicts a pulse generator 1100 having ten transistors that produces more symmetric pulses. More symmetric pulses may help provide similar timing margins on the rising and falling edges of the clock signal clk. FIG. 12 depicts a timing diagram for the pulse generator 1100 of FIG. 11. When clk transitions to a logic one, clkpb transitions to a logic zero. Then, clkb transitions to a logic zero after one inverter delay causing clkpb to transition to a logic one. Thus, a brief pulse P3 is generated on clkpb on the rising edge of clk. When clk transitions to a logic zero, clkb transitions to a logic one after a one inverter delay causing clkpb to transition to a logic zero. Then, after one inverter delay, clkd transitions to a logic zero causing clkpb to transition to a logic one. Thus, a brief low going pulse P4 is generated on clkpb on the falling edge of clk. As FIG. 12 depicts, the pulses P3, P4 on clkpb produced in response to the rising and falling edges of clk, respectively, are generally substantially symmetrical (i.e., have about the same pulse duration and/or may have minor discrepancies in the pulse shapes).

Figure 13A:
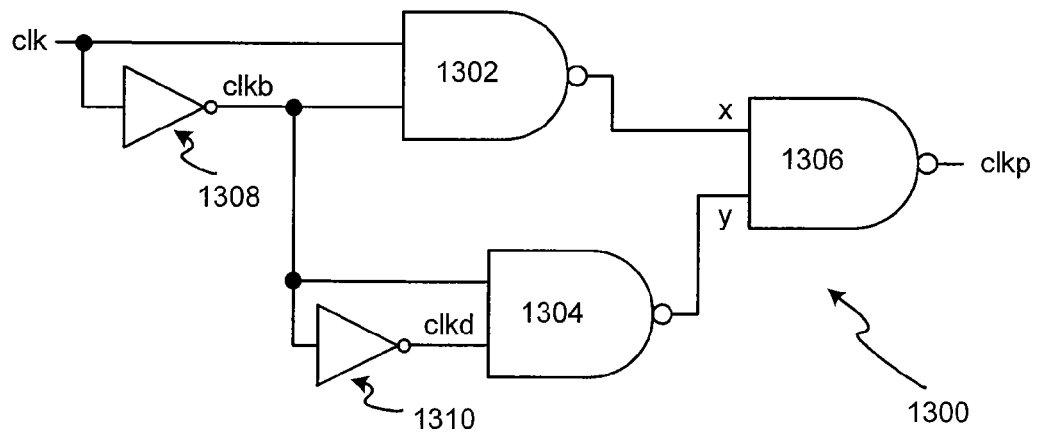
FIG. 13A depicts an explicit pulse generator using three NAND gates and two delay inverters.
Figure 13B:
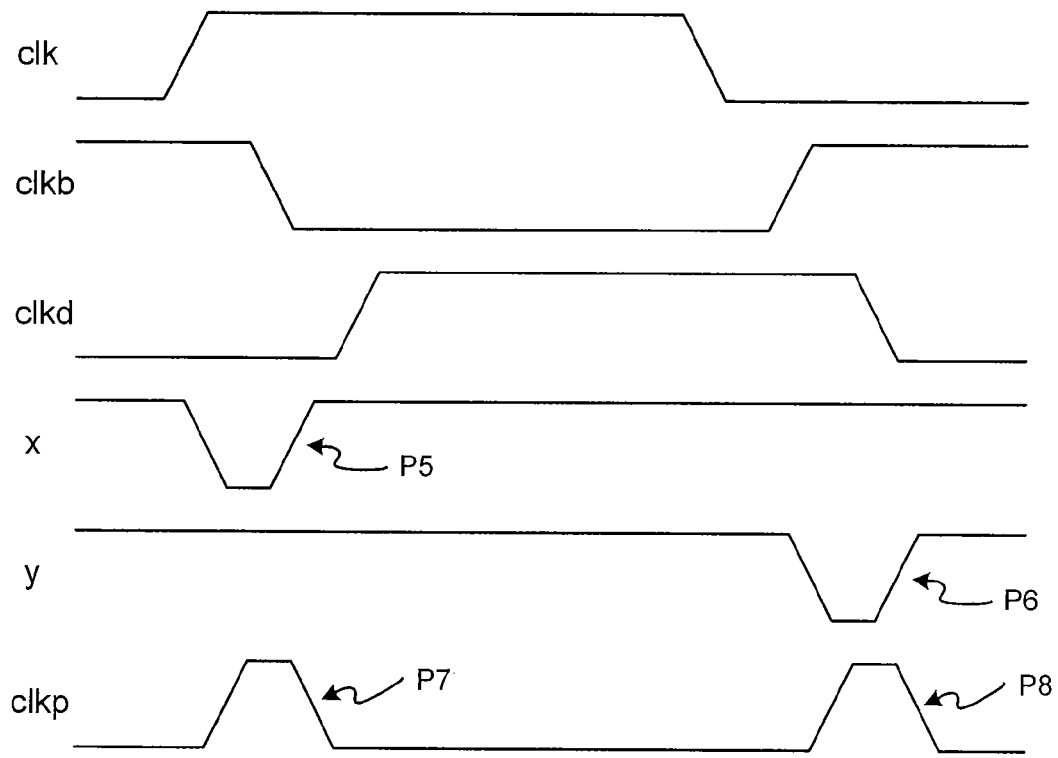
FIG. 13B depicts a timing diagram of the explicit pulse generator of FIG. 13A.

FIG. 13A depicts another pulse generator 1300 using three NAND gates and two inverters. Inverter 1308 and NAND gate 1302 form a clock chopper that generates a low-going pulse on the rising edge of the clk signal. Inverter 1310 and NAND gate 1304 form another clock chopper that generates a low-going pulse on the falling edge of the clk signal. The NAND gate 1306 combines the two separate low-going pulse signals x, y into clock signal clkp having high-going pulses. FIG. 13B depicts a timing diagram for the pulse generator 1300 depicted in FIG. 13A. When clk transitions to a logic one, node x transitions to a logic zero. Then when clkb transitions to a logic zero, node x transitions to a logic one. Thus, a brief low going pulse P5 appears on the output of the NAND gate 1302 (signal x) in response to a rising edge on clk. When clkb transitions to a logic one, node y transitions to a logic zero. When clkd transitions to a logic zero, node y transitions to a logic one. Thus, a brief low going pulse P6 appears on the output of the NAND gate 1304 (signal y) in response to a falling edge on clk. The output of NAND gate 1306 generates clkp by combing the two low-going pulse signals x, y into clock signal clkp having high-going pulses P7, P8 that are substantially symmetrical.

Figure 13C:
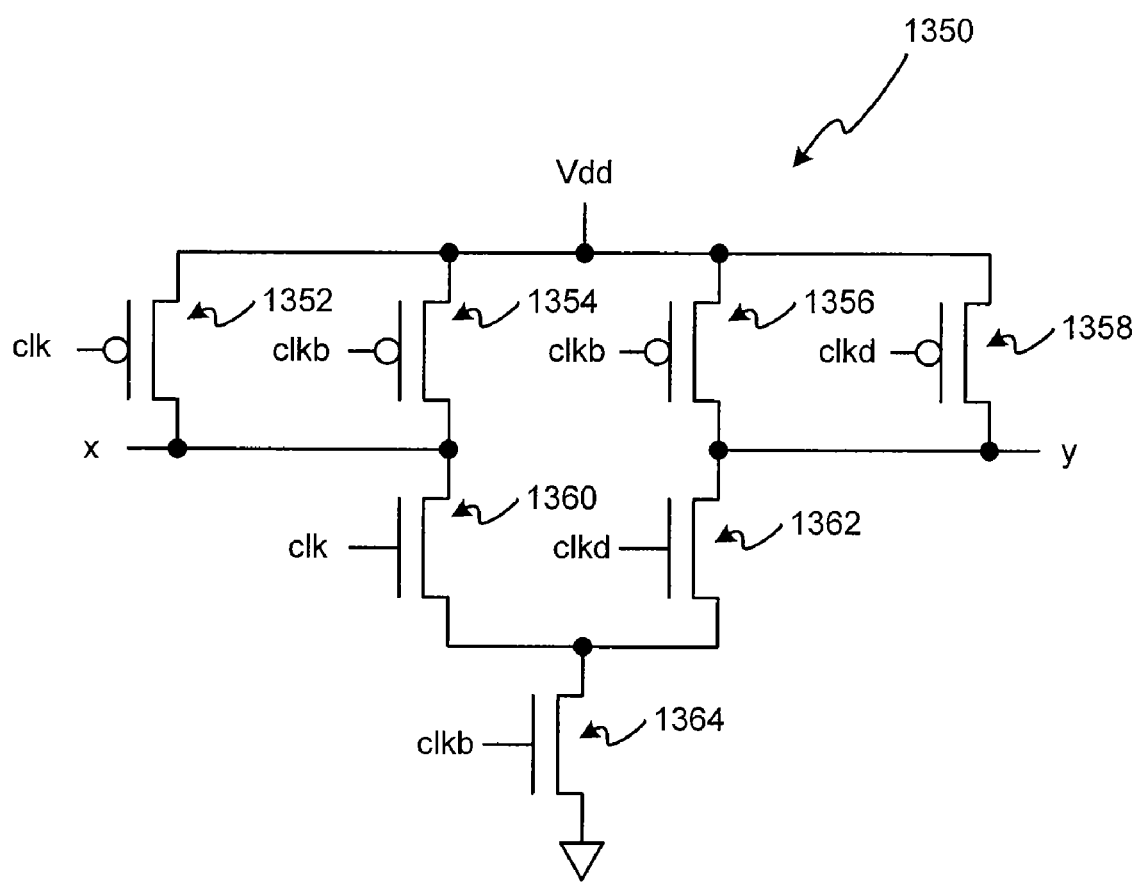
FIG. 13C depicts an implementation for the two NAND gates 1302, 1304 of FIG. 13A that share a clkb transistor.

Note that a clkb transistor may be shared between the NAND gates 1302, 1304 using the principle of multiple output static logic as described in U.S. patent application Ser. No. 11/513605, titled "Multi-Output Static Logic," filed on Aug. 30, 2006, naming David Harris and Zhih-Kong Yang as inventors, the disclosure of which is hereby incorporated by reference as if set forth fully herein. FIG. 13C depicts one implementation for the two NAND gates 1302, 1304 that share a clkb transistor. This results in a fifteen transistor pulse generator design.

Figure 14:
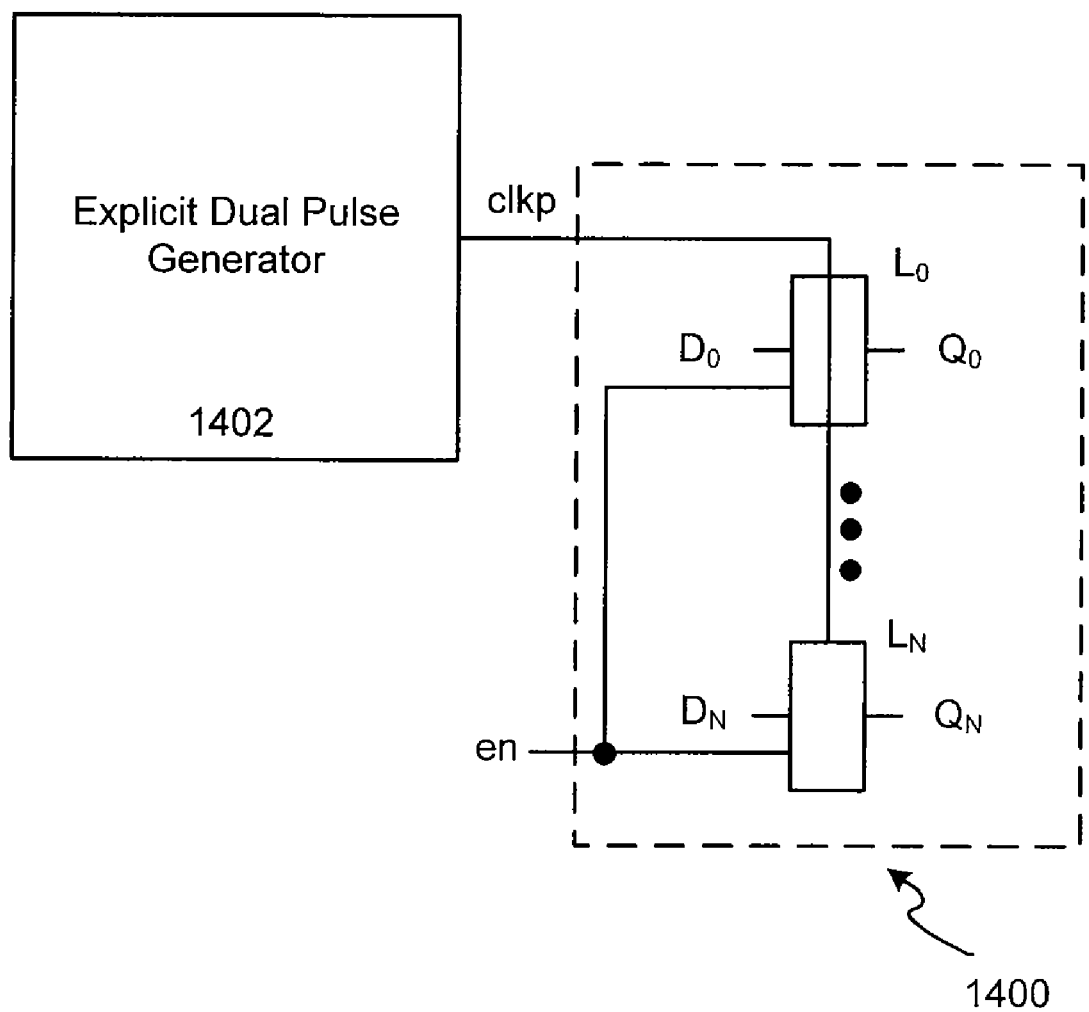
FIG. 14 depicts an explicit pulse generator driving a bank of pulsed latches.

An advantage of using an explicit pulse generator 1402, such as depicted in FIGS. 11 and 13B, is that it may be shared across a bank 1400 of dual edge triggered pulse latches $L_0$ to $L_N$, as depicted in FIG. 14. The bank 1400 of pulse latches may also have a common enable signal en.

Sequencing elements such as flip-flops and latches may have an enable input. When the enable input is a logic zero, the element retains its state independently of the clock. Dual edge triggered flip-flops and dual-edge triggered pulsed latches may be disabled by using an external circuit to stop the clock. The external circuit generally has to be able to stop the clock in both the logic one state and the logic zero state. Alternatively, an extra series enable transistor may be inserted in the implicitly pulsed latch circuit, at the expense of increasing the height of the tall stack. Similarly, an extra series transistor may be placed in the explicit pulse generator to lock out pulses when the latch should be disabled.

Figure 15A:
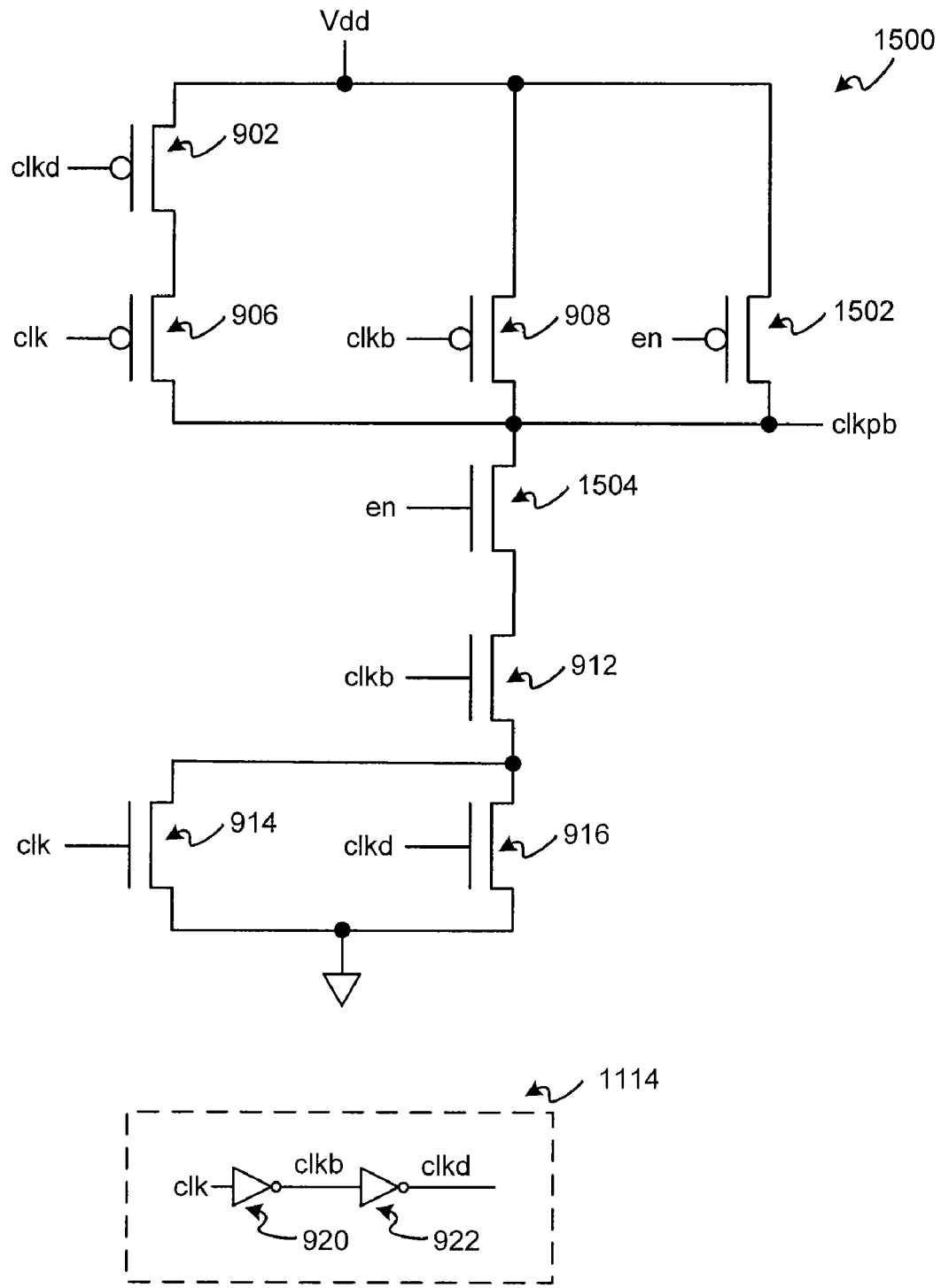
FIG. 15A depicts the explicit dual pulse generator of FIG. 11 modified to include an enable input gating the clock signal clk.
Figure 15B:
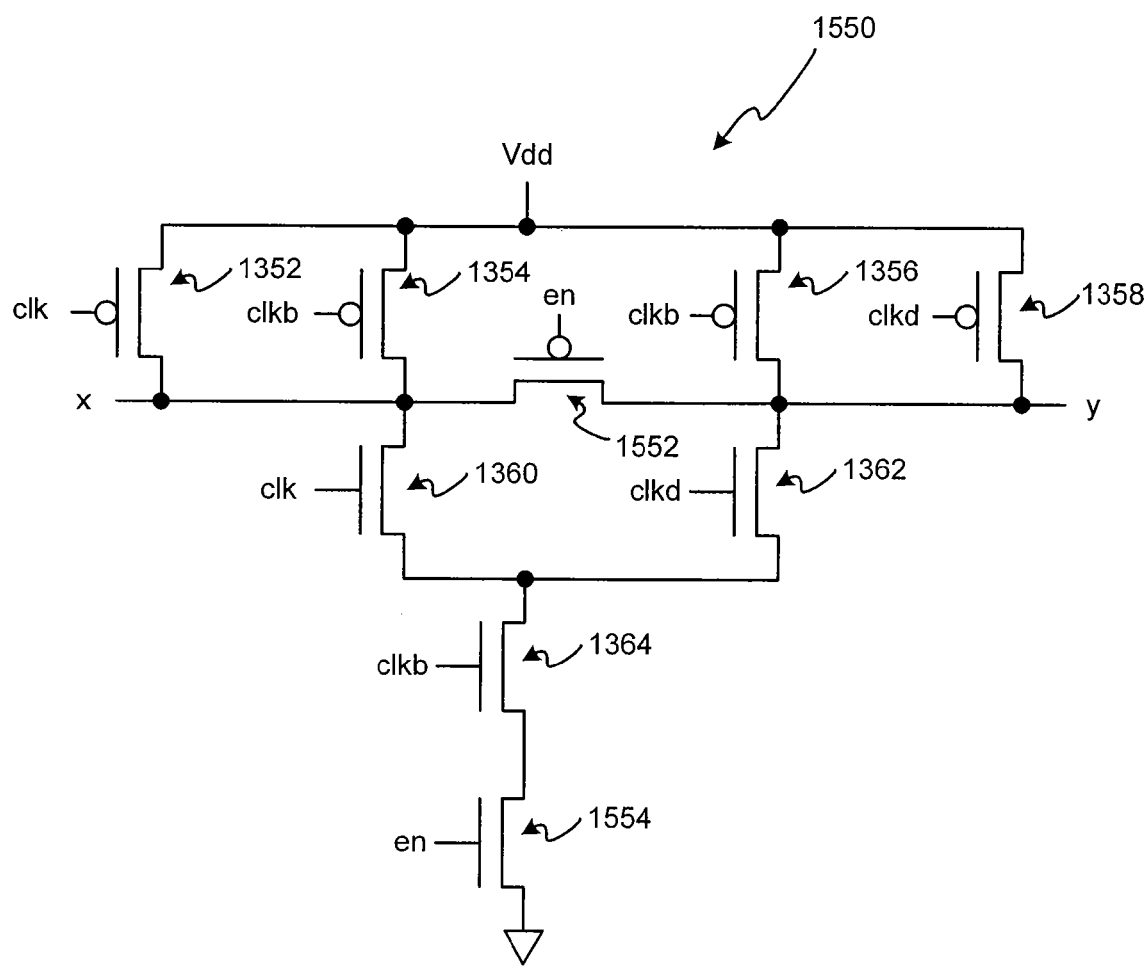
FIG. 15B depicts the explicit dual pulse generator of FIG. 13C modified to include an enable input.

FIG. 15A depicts the explicit dual pulse generator 1100 of FIG. 11 modified to form a pulse generator 1500 with an enable input gating the clock signal clk. FIG. 15B depicts the explicit dual pulse generator 1350 of FIG. 13C modified to form another pulse generator 1550 with an enable input. PMOS transistor 1552 serves as a keeper and is optional.

Many sequencing elements may require a reset signal to enter a known initial state on startup. The reset signal may be asynchronous or synchronous. An asynchronous reset forces the output Q low immediately, while a synchronous reset waits for the clock. A settable sequencing element has a set signal that forces the output high instead of low.

Figure 16:
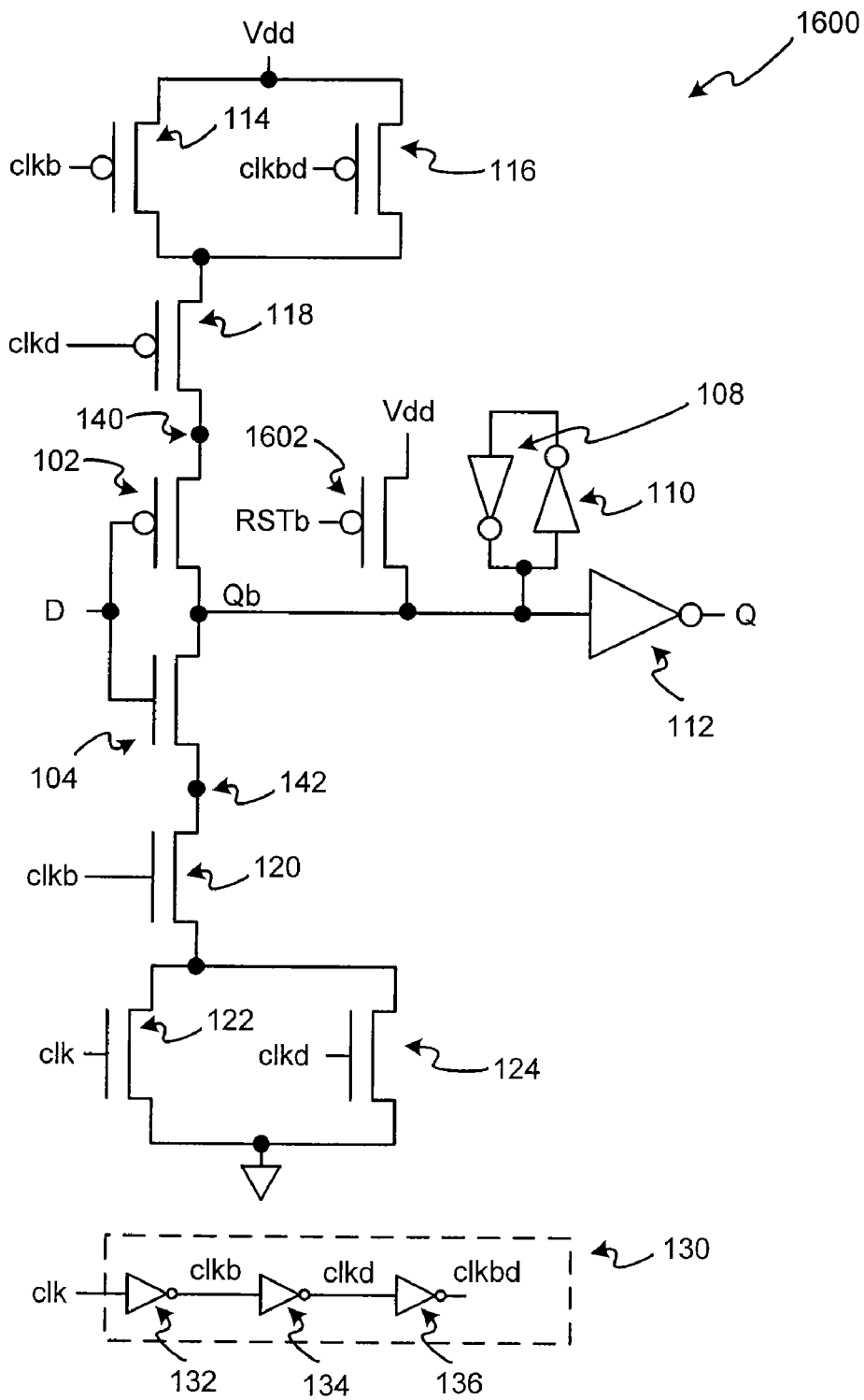
FIG. 16 depicts the implicitly pulsed dual edge triggered Jamb pulsed latch of FIG. 1B with an asynchronous reset.
Figure 17:
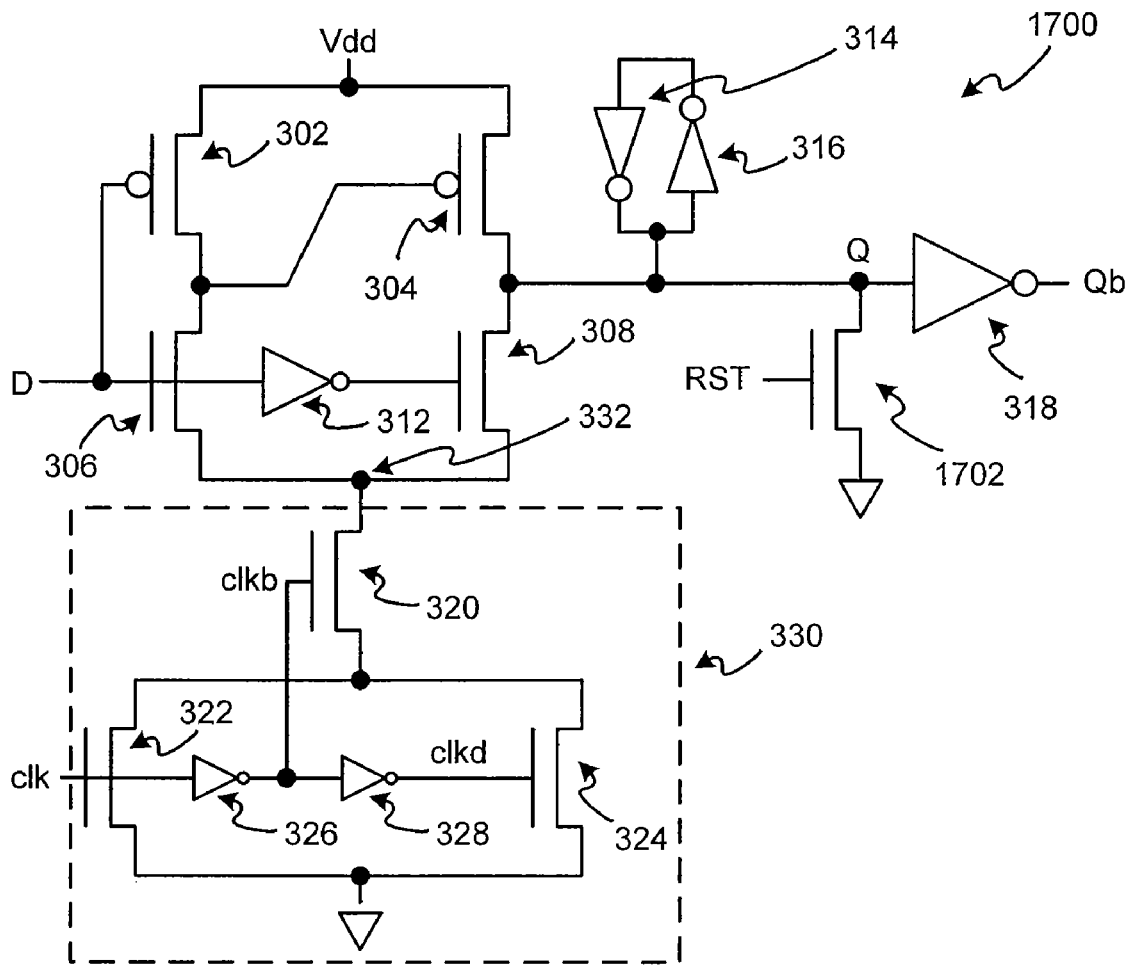
FIG. 17 depicts the implicitly pulsed dual edge triggered Fairbanks pulsed latch of FIG. 3B with an asynchronous reset.
Figure 18:
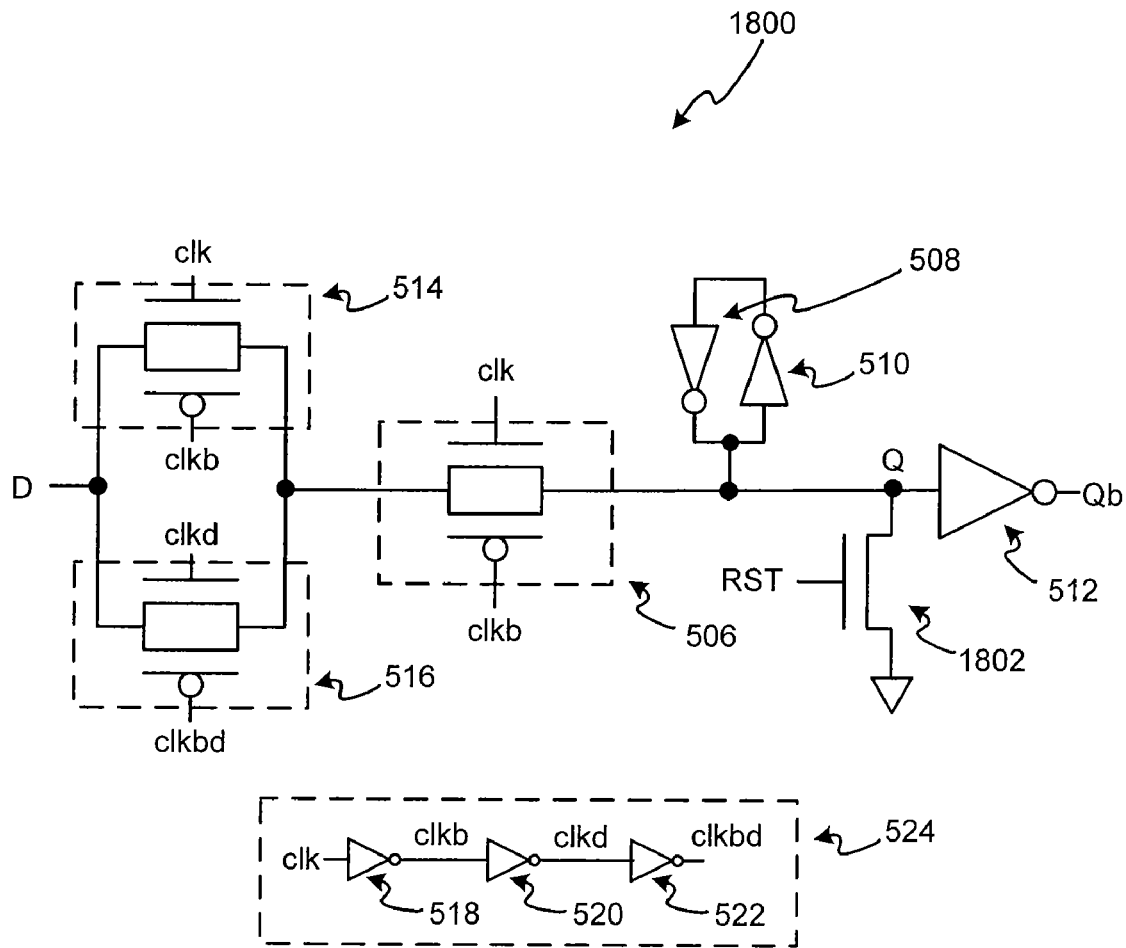
FIG. 18 depicts the implicitly pulsed dual edge triggered transmission gate latch of FIG. 5B with an asynchronous reset.
Figure 19:
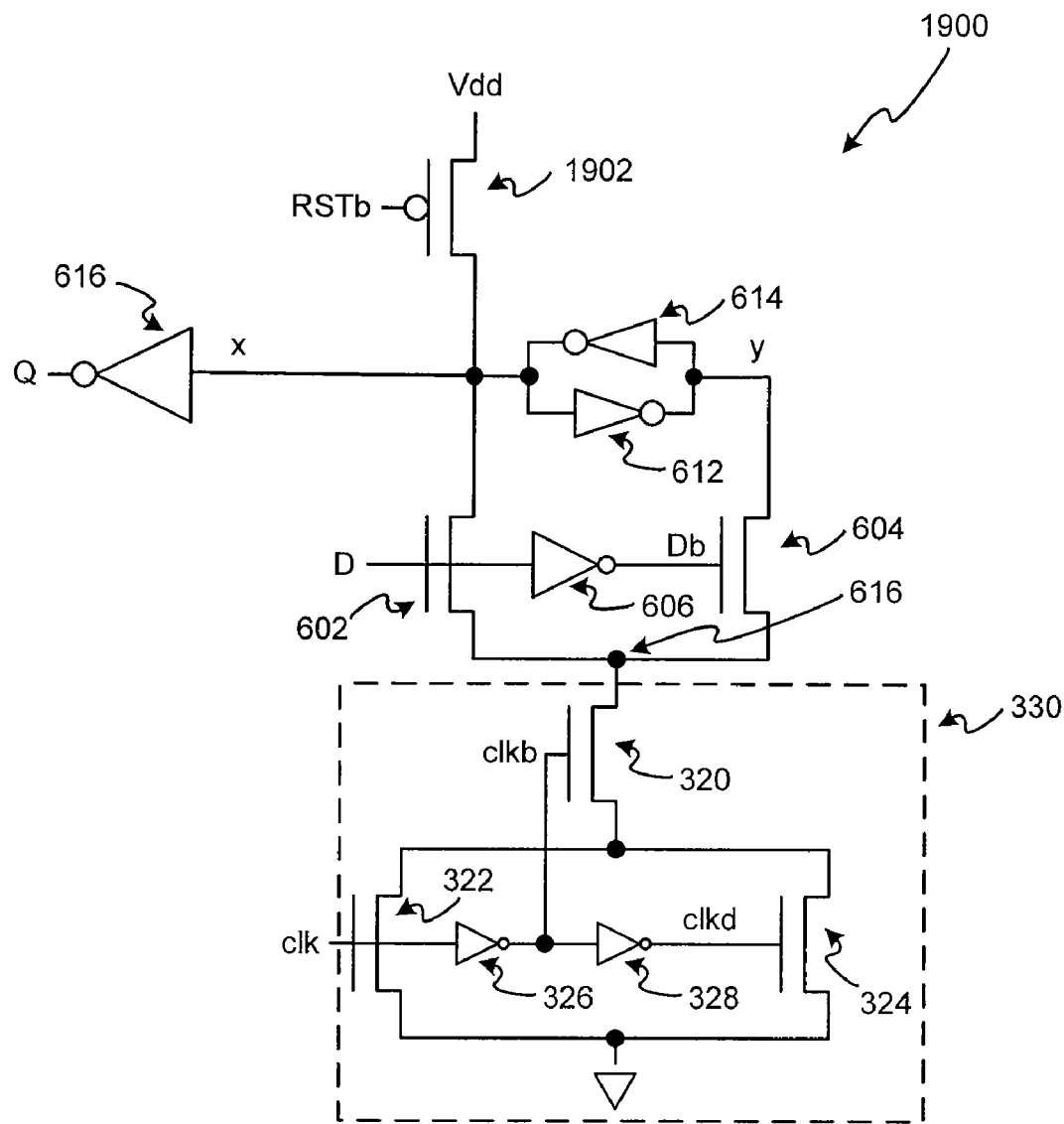
FIG. 19 depicts the differential implicitly pulsed latch of FIG. 6 with an asynchronous reset.

Implicitly pulsed latches may be reset asynchronously with a strong transistor tied directly to the state node as depicted in FIGS. 16-19. FIG. 16 depicts an implicitly pulsed dual edge triggered Jamb latch with an asynchronous reset using a strong transistor 1602 tied to state node Qb. FIG. 17 depicts an implicitly pulsed dual edge triggered Fairbanks pulsed latch 1700 with an asynchronous reset using a strong transistor 1702 tied to state node Q. FIG. 18 depicts an implicitly pulsed dual edge triggered transmission gate latch 1800 with an asynchronous reset using a strong transistor 1802 tied to state node Q. FIG. 19 depicts a differential implicitly pulsed dual edge triggered pulsed latch 1900 with an asynchronous reset using a strong transistor 1902 tied to state node x (Qb).

Figure 20:
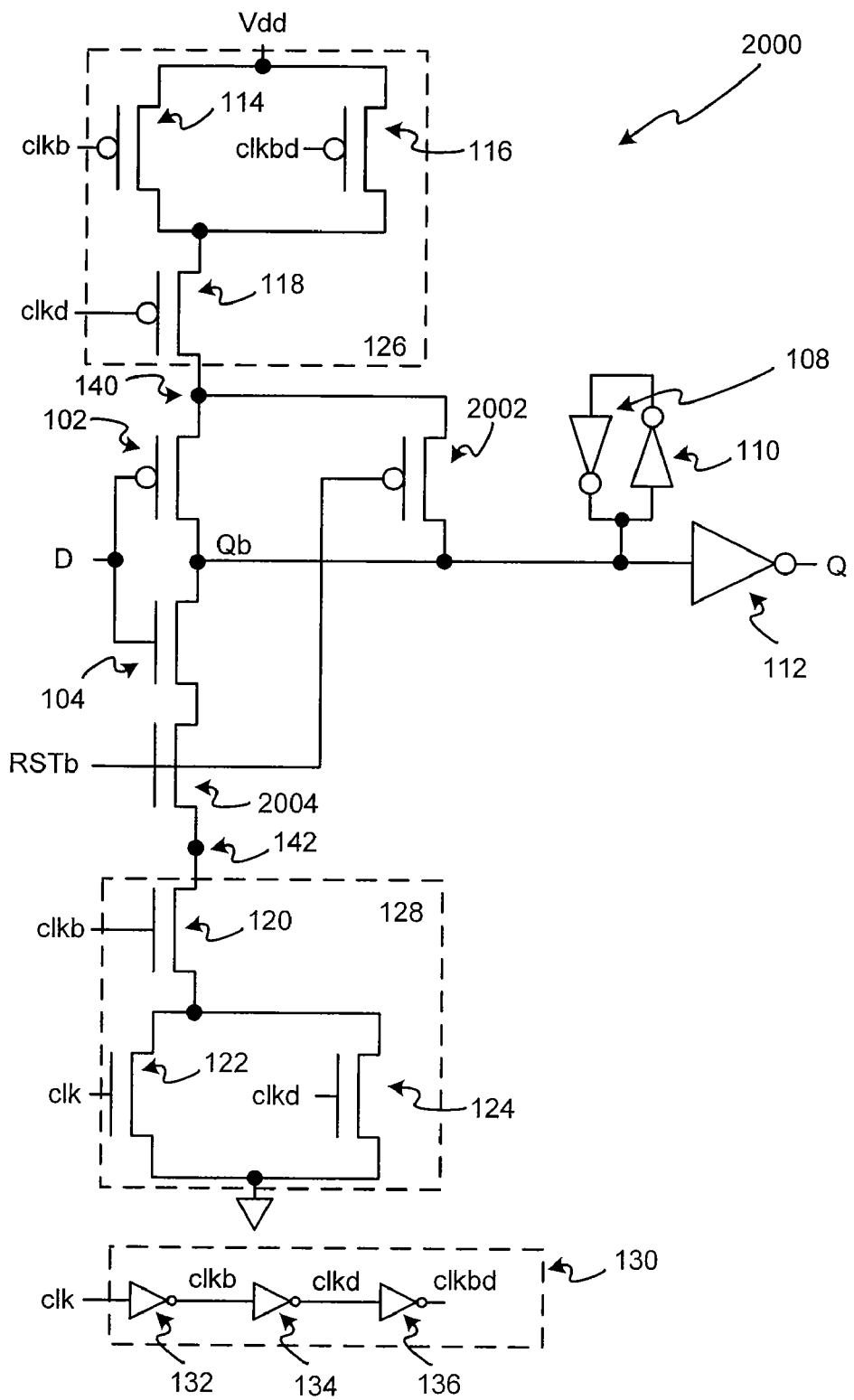
FIG. 20 depicts the implicitly pulsed dual edge triggered Jamb pulsed latch of FIG. 1B with a synchronous reset.

Implicitly pulsed latches may be set or reset synchronously with extra transistors in series and parallel with the data input. FIG. 20 depicts an implicitly pulsed dual edge triggered jamb latch 2000 with a synchronous reset. When RSTb is a logic one, NMOS transistor 2004 is conducting and PMOS transistor 2002 is not conduction, so the latch behaves normally. When RSTb is a logic zero, NMOS transistor 2004 is not conducting and PMOS transistor 2002 is conducting, so the latch drives Qb to a logic one when the clock transitions, causing Q to be synchronously reset. By placing the NMOS in parallel and the PMOS in series, the latch becomes synchronously settable. Other dual edge triggered latches may be modified to be synchronously settable or resettable using the same technique of extra series and/or parallel transistors. However, adding series transistors may slow the latch.

Figure 21:
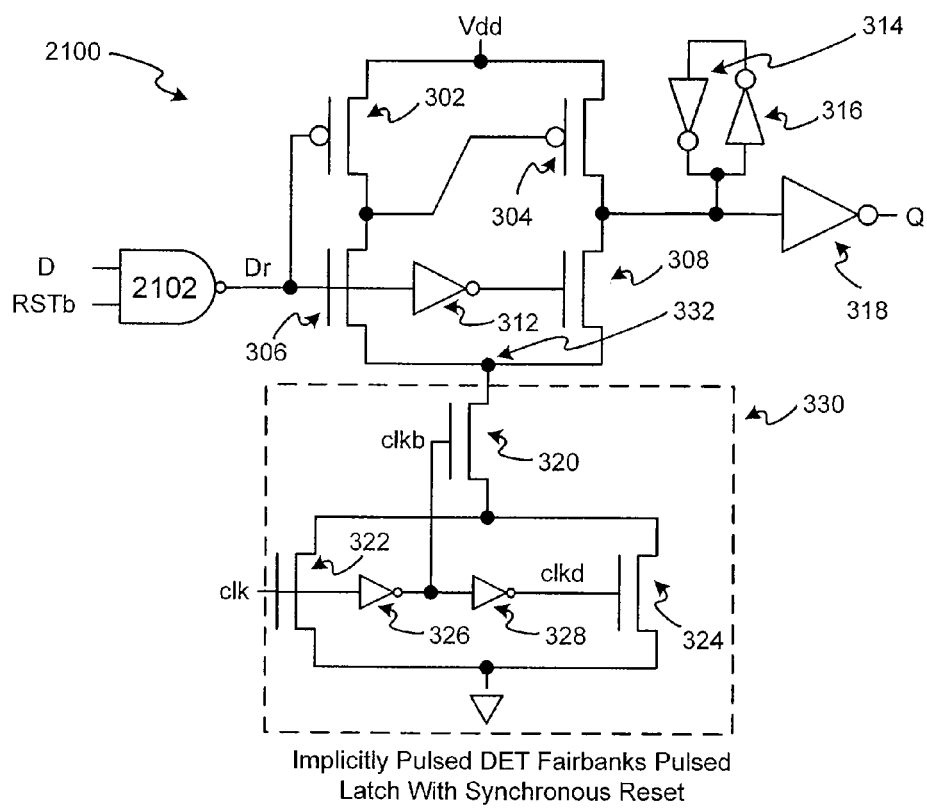
FIG. 21 depicts the implicitly pulsed dual edge triggered Fairbanks pulsed latch of FIG. 3B with a synchronous reset.
Figure 22:
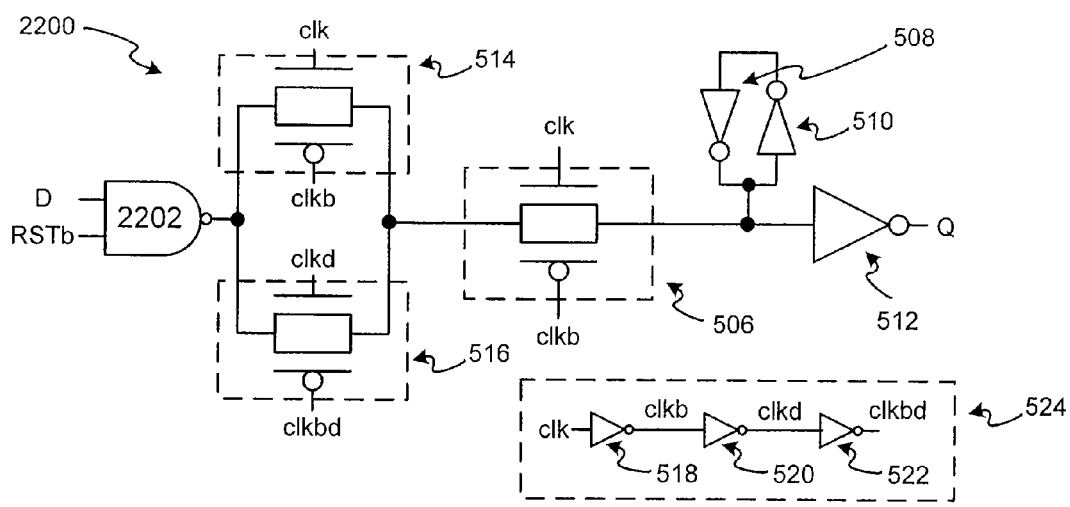
FIG. 22 depicts the implicitly pulsed dual edge triggered transmission gate latch of FIG. 5B with a synchronous reset.
Figure 23:
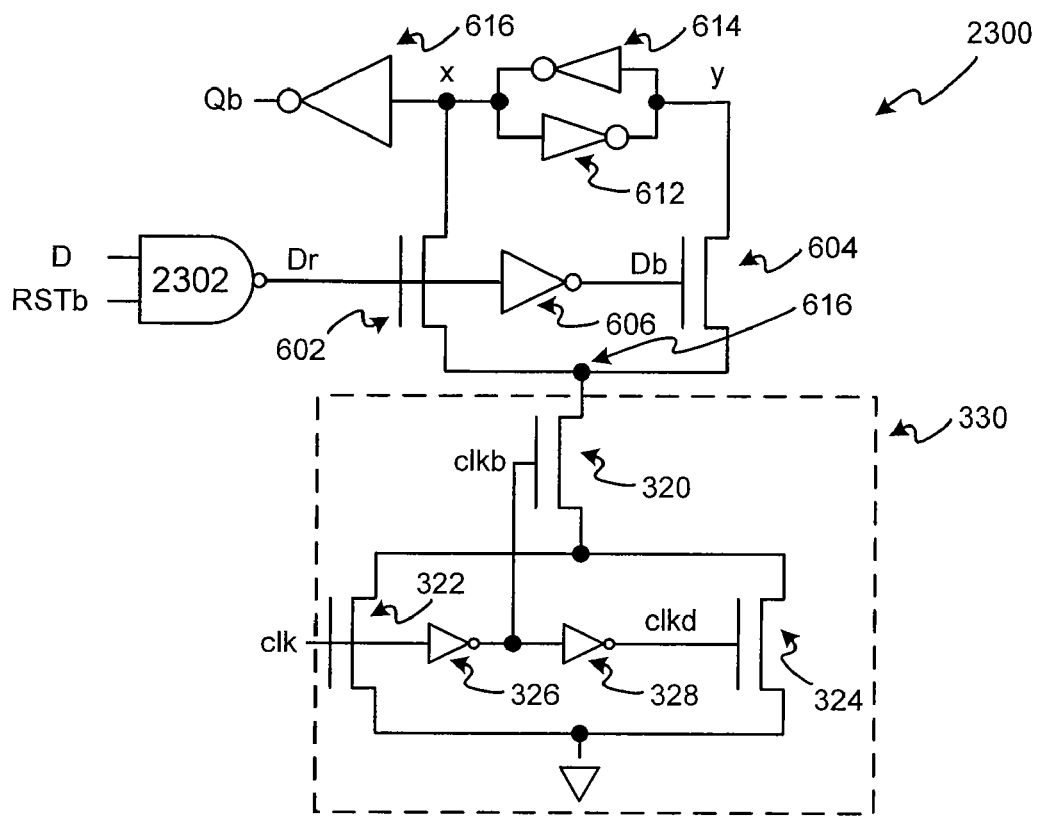
FIG. 23 depicts the differential implicitly pulsed latch of FIG. 6 with a synchronous reset.
Figure 24:
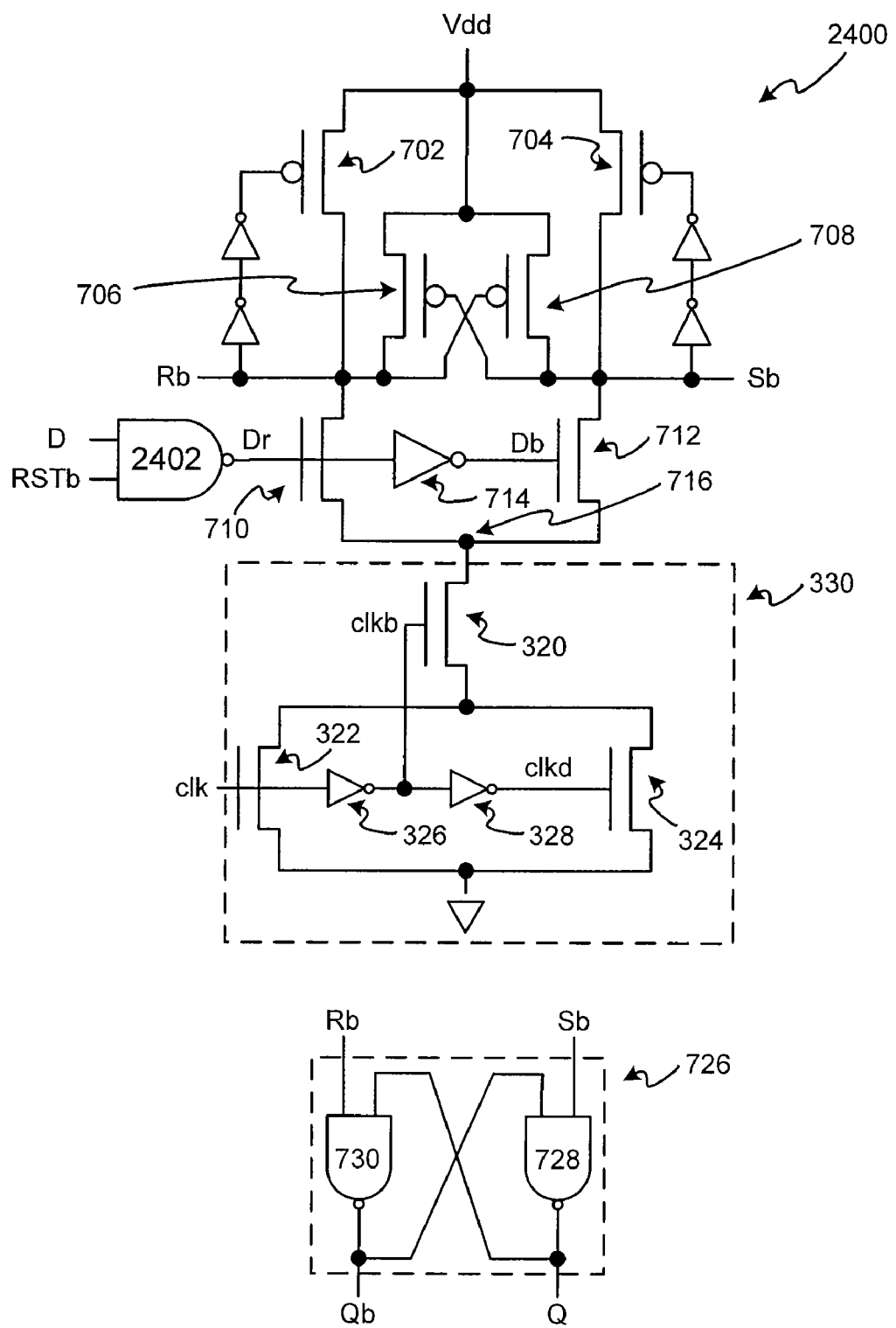
FIG. 24 depicts the self-resetting differential dual edge triggered pulsed latch circuit of FIG. 7 with a synchronous reset.

Alternatively, the D input may be gated with the reset using a NAND gate as depicted in FIGS. 21-24. FIG. 21 depicts an implicitly pulsed dual edge triggered Fairbanks latch 2100 with a synchronous reset using a NAND gate 2102. FIG. 22 depicts an implicitly pulsed transmission gate latch 2200 with a synchronous reset using a NAND gate 2202. FIG. 23 depicts a differential implicitly pulsed dual edge triggered pulsed latch 2300 with a synchronous reset using a NAND gate 2302. FIG. 24 depicts the self-resetting differential dual edge triggered pulsed latch circuit of FIG. 7 modified to form a self-resetting differential dual edge triggered pulsed latch 2400 with a synchronous reset using a NAND gate 2402.

As will be recognized by those skilled in the art from the foregoing description of example embodiments of the invention, numerous variations of the described embodiments may be made without departing from the spirit and scope of the invention. For example, the implicit pulse generator used to clock a dual edge triggered pulsed latch may employ fixed or variable delay elements or delay elements implemented using microstrip lines or a number of inverters or other gates connected in series, or may obtain the pulses from a multiphase clock generator such as a phase-locked loop or delay-locked loop. The explicit dual pulse generator may be implemented using other logic gate configurations that result in the same Boolean algebraic functions or that otherwise generate pulses on both edges of the clock. Although embodiments of the present invention have been depicted using CMOS transistors, this is by way of example and not limitation. The invention could also be implemented using other types of transistors, superconducting circuit elements, or any other technology capable of implementing digital logic. Further, while the present invention has been described in the context of specific embodiments and processes, such descriptions are by way of example and not limitation. Accordingly, the proper scope of the present invention is specified by the following claims and not by the preceding examples.

What is claimed is:

1. An implicitly pulsed dual edge triggered pulsed latch comprising:
   a clock input configured to receive a clock signal;
   an overlapping clock generator operably coupled to the clock input and configured to generate a plurality of overlapping clock signals in response to the clock signal;
   a transparency circuit operably coupled to the overlapping clock generator and clock input, the transparency circuit having a first output node that transitions from a high resistance state to a low resistance state and back to the high resistance state in response to an edge transition on the clock signal;
   a transparent latch circuit comprising:
      an input node,
      a circuit output node and
      a transparency node, the transparency node operably coupled to the first output node and, in conjunction with the transparency circuit, is configured to cause the transparent latch to become transparent when the transparency node is at the low resistance state; and
   wherein the dual edge triggered pulsed latch passes a logic value on the input node to the circuit output node in response to the edge transition on the clock signal.

2. The dual edge triggered pulsed latch of claim 1 wherein the pulsed latch circuit is selected from the group consisting of a Fairbanks latch, a differential pulsed latch, a self-resetting differential pulsed latch, a self-resetting differential pulsed latch with a SR output latch, and a self-resetting differential pulsed latch with a Nikolic output latch.

3. The dual edge triggered pulse latch of claim 1 further comprising a synchronous reset input.

4. The dual edge triggered pulse latch of claim 1 further comprising an asynchronous reset input.

5. The dual edge triggered pulsed latch of claim 1 further comprising an enable input.

6. The dual edge triggered pulse latch of claim 1 further comprising a synchronous set input operably coupled to the transparent latch circuit.

7. The dual edge triggered pulse latch of claim 1 further comprising an asynchronous set input operably coupled to the transparent latch circuit.

8. The dual edge triggered pulsed latch of claim 1 wherein the overlapping clock generator comprises a plurality of inverting delay elements operably connected in series, each inverting delay element having an output tap corresponding to one of the plurality of overlapping clock signals.

9. The dual edge triggered pulsed latch of claim 8 wherein each inverting delay element comprises an inverter.

10. The dual edge triggered pulsed latch of claim 8 wherein each inverting delay element is adjustable.

11. The dual edge triggered pulsed latch of claim 1 wherein the transparency circuit comprises:
   a first switching element operably coupled to the first output node and configured to become transparent when a first overlapping clock signal of the plurality of overlapping clock signals is active;
   a second switching element operably coupled in series with the first switching element and a first voltage potential, the second switching element configured to become transparent when the clock signal is active; and
   a third switching element operably coupled in parallel with the second switching element and configured to become transparent when a second overlapping clock signal of the plurality of overlapping clock signals is active.

12. The dual edge triggered pulsed latch of claim 11 further comprising:
  a second transparency circuit operably coupled to the overlapping clock generator and clock input, the transparency circuit having a second output node that transitions from the high resistance state to the low resistance state and back to the high resistance state in response to an edge transition on the complement of the clock signal; and
  wherein the transparent latch circuit has a second transparency node operably coupled to the second output node and configured to cause the transparent latch to become transparent when the transparency node is at the low resistance state, and
  wherein the second transparency circuit comprises:
    a fourth switching element operably coupled to the second output node and configured to become transparent when the second overlapping clock signal is active;
    a fifth switching element operably coupled in series with the fourth switching element and a second voltage potential, the second switching element configured to become transparent when the first overlapping clock signal is active; and
    a sixth switching element operably coupled in parallel with the fifth switching element and configured to become transparent when a third overlapping clock signal is active.

13. The dual edge triggered pulsed latch of claim 12 wherein the transparent latch is a jamb latch.

14. The dual edge triggered pulsed latch of claim 11 wherein each of the first, second and third switching elements comprises a nMOS transistor.

15. The dual edge triggered pulsed latch of claim 11 wherein each of the first, second and third switching elements comprises a pMOS transistor.

* * * * *